(12) United States Patent
Zhang et al.

(10) Patent No.: US 11,088,170 B2
(45) Date of Patent: Aug. 10, 2021

(54) THREE-DIMENSIONAL FERROELECTRIC MEMORY ARRAY INCLUDING INTEGRATED GATE SELECTORS AND METHODS OF FORMING THE SAME

(71) Applicant: SANDISK TECHNOLOGIES LLC, Addison, TX (US)

(72) Inventors: Yanli Zhang, San Jose, CA (US); Johann Alsmeier, San Jose, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 16/694,340

(22) Filed: Nov. 25, 2019

(65) Prior Publication Data

US 2021/0159248 A1    May 27, 2021

(51) Int. Cl.
| | |
|---|---|
| *H01L 27/11* | (2006.01) |
| *H01L 27/11597* | (2017.01) |
| *G11C 11/22* | (2006.01) |
| *G11C 5/06* | (2006.01) |
| *H01L 27/1159* | (2017.01) |
| *H01L 29/78* | (2006.01) |
| *H01L 27/11587* | (2017.01) |
| *H01L 29/66* | (2006.01) |

(52) U.S. Cl.
CPC ........ *H01L 27/11597* (2013.01); *G11C 5/063* (2013.01); *G11C 11/223* (2013.01); *H01L 27/1159* (2013.01); *H01L 27/11587* (2013.01); *H01L 29/6684* (2013.01); *H01L 29/78391* (2014.09)

(58) Field of Classification Search
None
See application file for complete search history.

(56) References Cited

U.S. PATENT DOCUMENTS

| | | | |
|---|---|---|---|
| 5,329,486 A * | 7/1994 | Lage | G11C 11/06035 365/145 |
| 5,899,714 A * | 5/1999 | Farrenkopf | H01L 21/822 438/202 |
| 6,066,880 A * | 5/2000 | Kusunoki | H01L 21/743 257/356 |
| 9,941,299 B1 | 4/2018 | Chen et al. | |
| 10,249,683 B1 | 4/2019 | Lille et al. | |
| 10,381,411 B2 | 8/2019 | Lille | |

(Continued)

OTHER PUBLICATIONS

Notification of Transmittal of the International Search Report and Written Opinion of the International Search Authority for International Patent Application No. PCT/US2020/024813, dated Aug. 21, 2020, 10 pages.

(Continued)

*Primary Examiner* — Tan T. Nguyen
(74) *Attorney, Agent, or Firm* — The Marbury Law Law Group PLLC

(57) ABSTRACT

A ferroelectric field effect transistor (FeFET) includes a semiconductor channel, a source region contacting one end of the semiconductor channel, a drain region contacting a second end of the semiconductor channel, a gate electrode, a ferroelectric gate dielectric layer located between the semiconductor channel and the gate electrode, and a bidirectional selector material layer located between the gate electrode and the ferroelectric gate dielectric layer.

20 Claims, 30 Drawing Sheets

(56) References Cited

U.S. PATENT DOCUMENTS

| | | |
|---|---|---|
| 2001/0012213 A1 | 8/2001 | Braun et al. |
| 2002/0006053 A1 | 1/2002 | Murakuki et al. |
| 2002/0012264 A1 | 1/2002 | Ishiwara |
| 2003/0028745 A1 | 2/2003 | Hosoi |
| 2004/0076053 A1 | 4/2004 | Choi et al. |
| 2004/0095181 A1 | 5/2004 | Ohtsuka et al. |
| 2006/0018144 A1 | 1/2006 | Oikawa et al. |
| 2015/0263261 A1* | 9/2015 | Nakayama ............ A61B 8/4494 310/319 |
| 2016/0181259 A1 | 6/2016 | Van Houdt et al. |
| 2017/0062523 A1 | 3/2017 | Sekino et al. |
| 2017/0098660 A1 | 4/2017 | Ramaswamy et al. |
| 2018/0277181 A1 | 9/2018 | Bedeschi |
| 2018/0323214 A1 | 11/2018 | Karda et al. |
| 2018/0330771 A1 | 11/2018 | Bedeschi |
| 2019/0147951 A1 | 5/2019 | Chen |
| 2019/0189688 A1 | 6/2019 | Lille |
| 2019/0237470 A1 | 8/2019 | Mine et al. |
| 2019/0244652 A1 | 8/2019 | Bedeschi |

OTHER PUBLICATIONS

U.S. Appl. No. 16/227,889, filed Dec. 20, 2018, SanDisk Technologies LLC.
U.S. Appl. No. 16/249,300, filed Jan. 16, 2019, SanDisk Technologies LLC.
U.S. Appl. No. 16/291,673, filed Mar. 4, 2019, SanDisk Technologies LLC.
U.S. Appl. No. 16/412,764, filed May 15, 2019, SanDisk Technologies LLC.
U.S. Appl. No. 16/442,858, filed Jun. 17, 2019, SanDisk Technologies LLC.
U.S. Appl. No. 16/454,458, filed Jun. 27, 2019, SanDisk Technologies LLC.
U.S. Appl. No. 16/454,475, filed Jun. 27, 2019, SanDisk Technologies LLC.
U.S. Appl. No. 16/456,736, filed Jun. 28, 2019, SanDisk Technologies LLC.
U.S. Appl. No. 16/457,687, filed Jun. 28, 2019, SanDisk Technologies LLC.
U.S. Appl. No. 16/457,721, filed Jun. 28, 2019, SanDisk Technologies LLC.
U.S. Appl. No. 16/530,256, filed Aug. 2, 2019, SanDisk Technologies LLC.
U.S. Appl. No. 16/541,289, filed Aug. 15, 2019, SanDisk Technologies LLC.
U.S. Appl. No. 16/568,668, filed Sep. 12, 2019, SanDisk Technologies LLC.
U.S. Appl. No. 16/577,176, filed Sep. 20, 2019, SanDisk Technologies LLC.

* cited by examiner

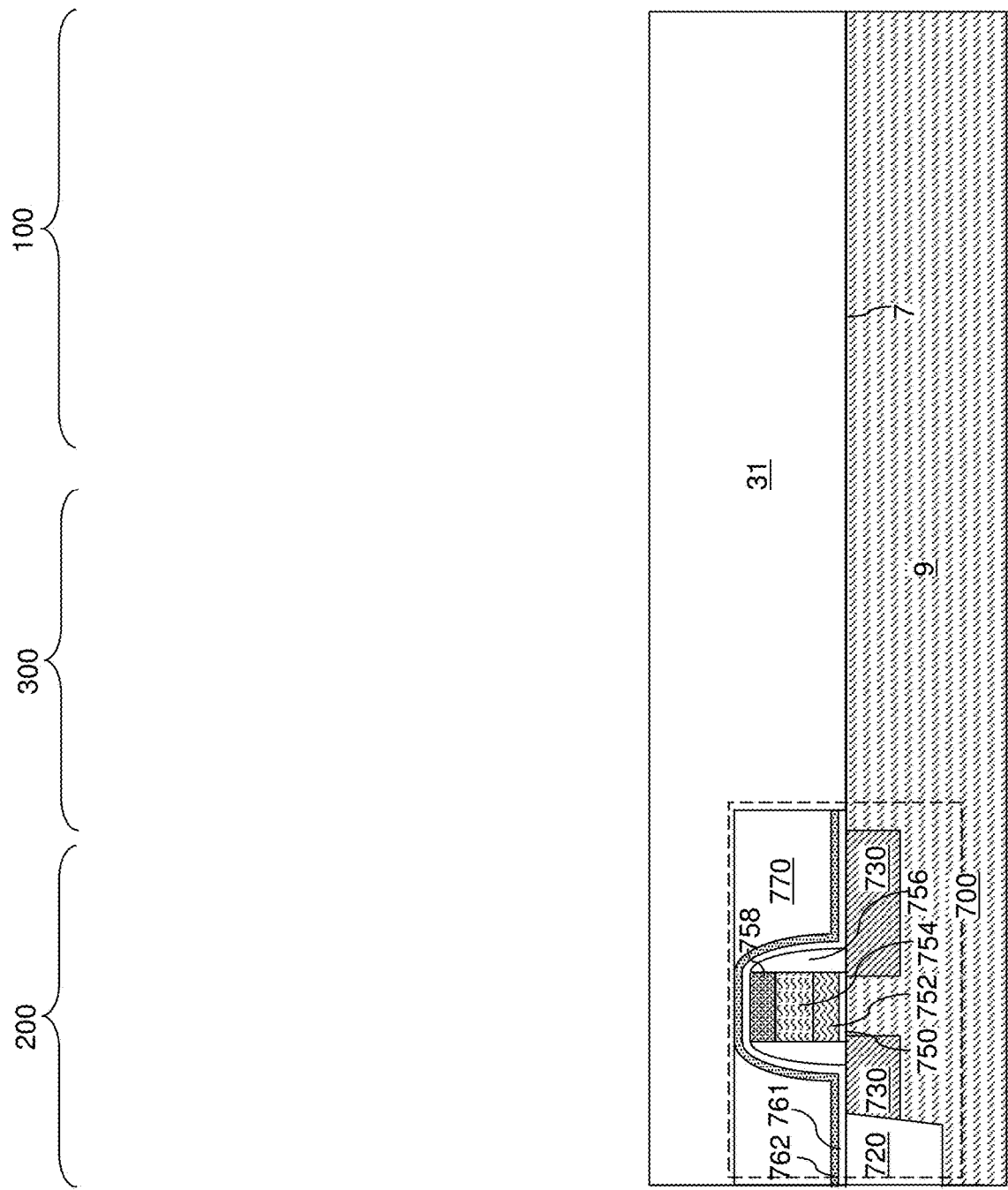

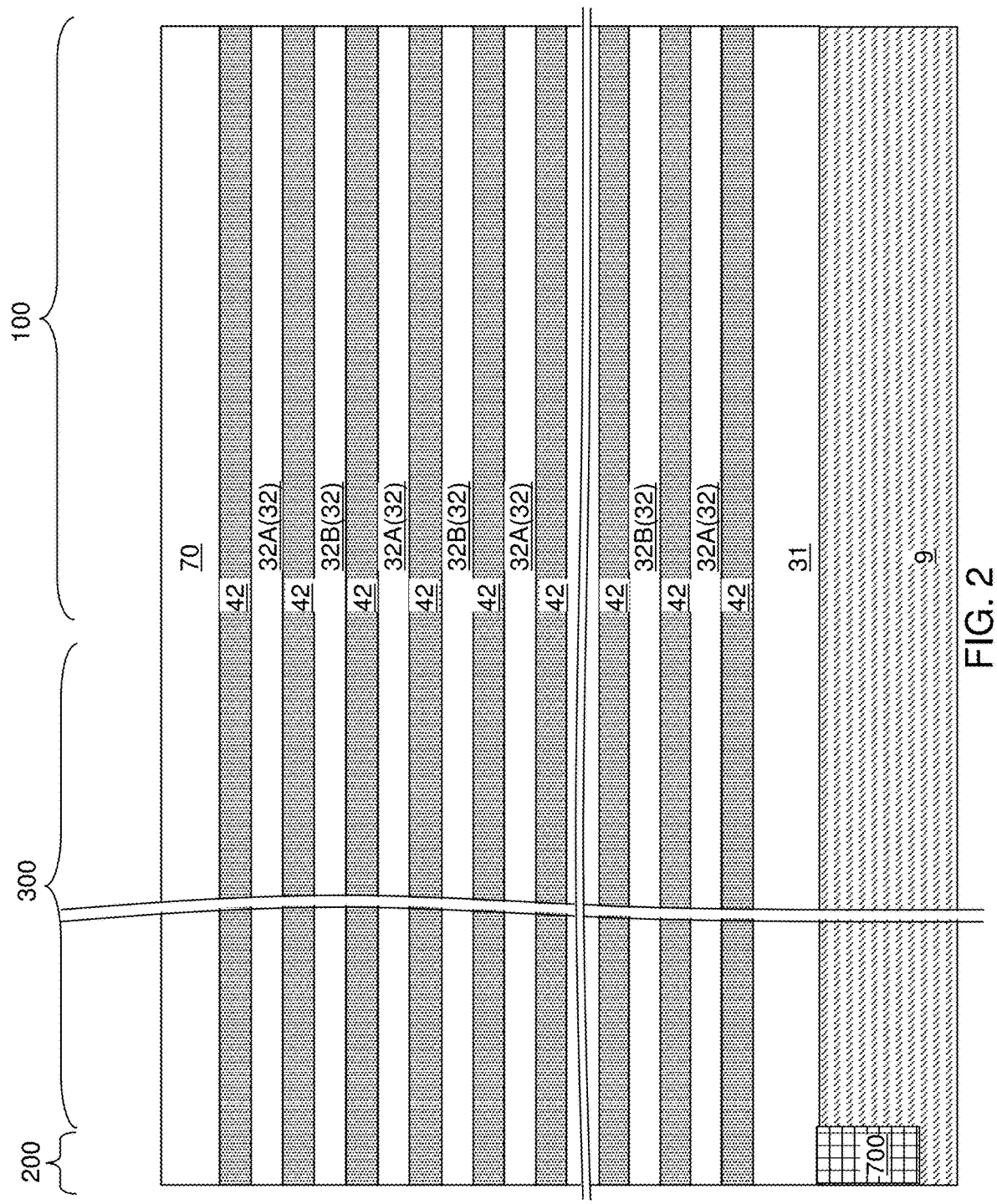

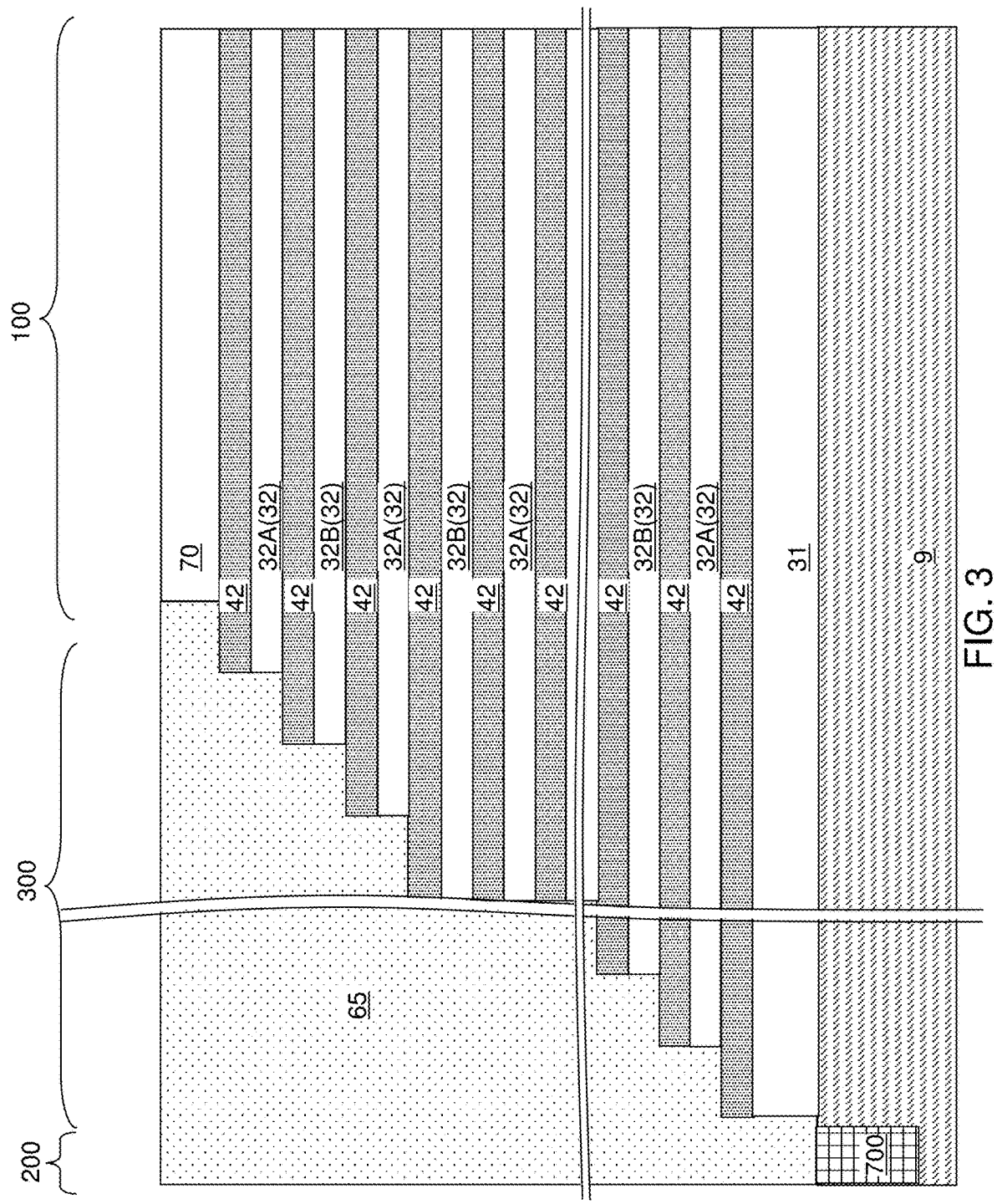

US 11,088,170 B2

1

THREE-DIMENSIONAL FERROELECTRIC MEMORY ARRAY INCLUDING INTEGRATED GATE SELECTORS AND METHODS OF FORMING THE SAME

FIELD

The present disclosure relates generally to the field of semiconductor devices, and particularly to a three-dimensional ferroelectric memory array including integrated gate selectors and methods of manufacturing the same.

BACKGROUND

A ferroelectric material refers to a material that displays spontaneous polarization of electrical charges in the absence of an applied electric field. The net polarization P of electrical charges within the ferroelectric material is non-zero in the minimum energy state. Thus, spontaneous ferroelectric polarization of the material occurs, and the ferroelectric material accumulates surfaces charges of opposite polarity types on two opposing surfaces. Polarization P of a ferroelectric material as a function of an applied voltage V thereacross displays hysteresis. The product of the remnant polarization and the coercive field of a ferroelectric material is a metric for characterizing effectiveness of the ferroelectric material.

A ferroelectric memory device is a memory device containing the ferroelectric material which is used to store information. The ferroelectric material acts as the memory material of the memory device. The dipole moment of the ferroelectric material is programmed in two different orientations (e.g., "up" or "down" polarization positions based on atom positions, such as oxygen and/or metal atom positions, in the crystal lattice) depending on the polarity of the applied electric field to the ferroelectric material to store information in the ferroelectric material. The different orientations of the dipole moment of the ferroelectric material may be detected by the electric field generated by the dipole moment of the ferroelectric material. For example, the orientation of the dipole moment may be detected by measuring electrical current passing through a semiconductor channel provided adjacent to the ferroelectric material in a field effect transistor ferroelectric memory device.

SUMMARY

According to an aspect of the present disclosure, a ferroelectric field effect transistor (FeFET) includes a semiconductor channel, a source region contacting one end of the semiconductor channel, a drain region contacting a second end of the semiconductor channel, a gate electrode, a ferroelectric gate dielectric layer located between the semiconductor channel and the gate electrode, and a bipolar selector material layer located between the gate electrode and the ferroelectric gate dielectric layer.

According to another aspect of the present disclosure, a method of forming a semiconductor device is provided, which comprises: forming channel-level insulating layers over a substrate; forming a vertical stack of semiconductor channels at levels of the channel-level insulating layers; forming a stack including, from one side to another, a ferroelectric gate dielectric layer, a bipolar selector material layer, and a gate electrode directly on the vertical stack of semiconductor channels; and providing a source region on one end of each of the semiconductor channels and a drain region on another end of each of the semiconductor chan-

2 nels, wherein each of the semiconductor channels, the source regions, and the drain regions contacts the ferroelectric gate dielectric layer, and each of the channel-level insulating layers contacts a respective one of the source regions and a respective one of the drain regions.

BRIEF DESCRIPTION OF THE DRAWINGS

FIG. 1 is a schematic vertical cross-sectional view of a first exemplary structure after formation of at least one peripheral device and a semiconductor material layer according to a first embodiment of the present disclosure.

FIG. 2 is a schematic vertical cross-sectional view of the first exemplary structure after formation of an alternating stack of insulating layers and sacrificial material layers according to the first embodiment of the present disclosure.

FIG. 3 is a schematic vertical cross-sectional view of the first exemplary structure after formation of stepped terraces and a retro-stepped dielectric material portion according to the first embodiment of the present disclosure.

DETAILED DESCRIPTION

Figure 4A:
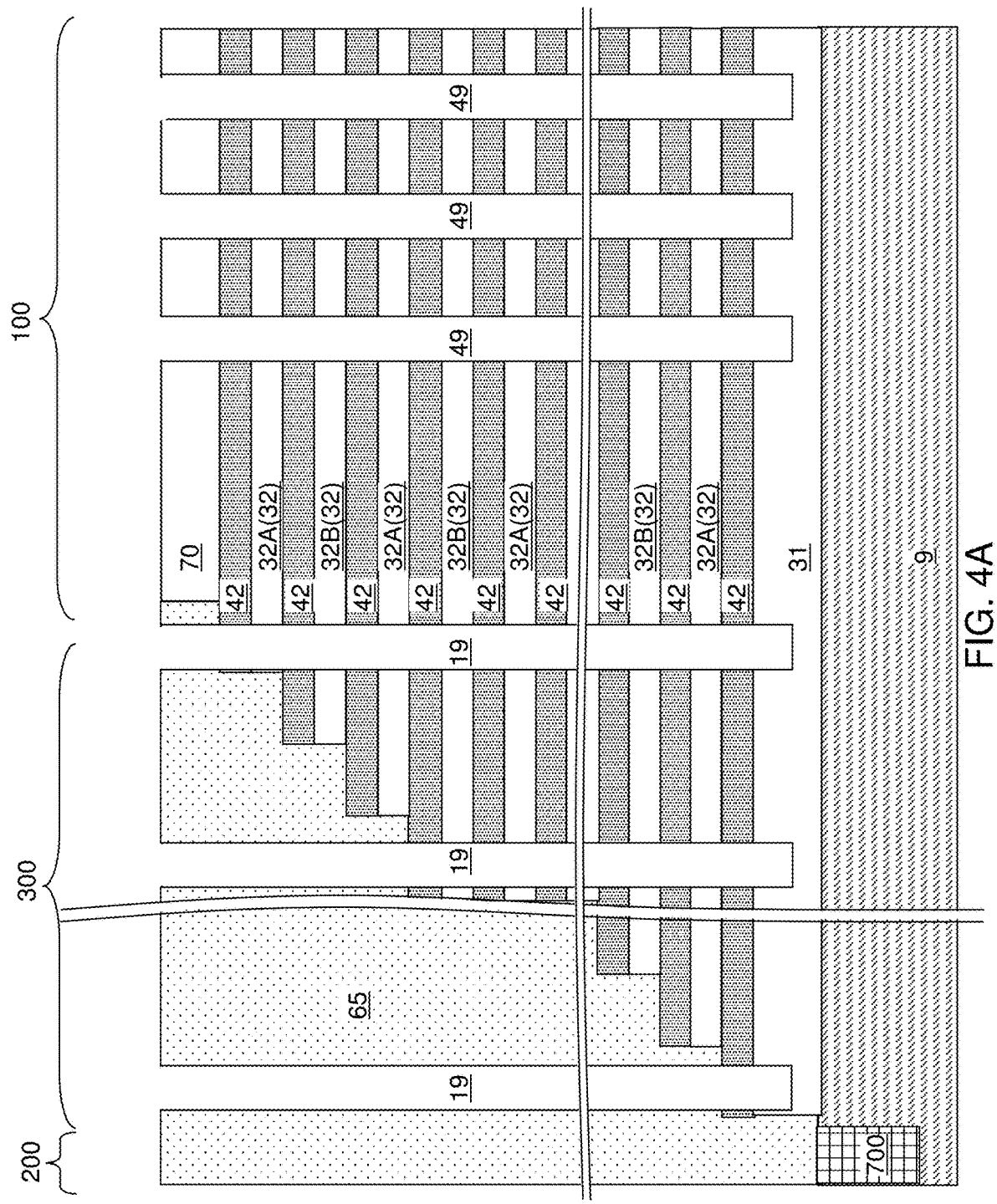
FIG. 4A is a schematic vertical cross-sectional view of the first exemplary structure after formation of memory openings and support openings according to the first embodiment of the present disclosure.

As discussed above, the present disclosure is directed to a three-dimensional ferroelectric memory array including integrated gate selectors and methods of manufacturing the same, the various aspects of which are described below.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. As used herein, a first element located "on" a second element may be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

A monolithic three-dimensional memory array is a memory array in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays.

Generally, a semiconductor package (or a "package") refers to a unit semiconductor device that may be attached to a circuit board through a set of pins or solder balls. A semiconductor package may include a semiconductor chip (or a "chip") or a plurality of semiconductor chips that are bonded thereamongst, for example, by flip-chip bonding or another chip-to-chip bonding. A package or a chip may include a single semiconductor die (or a "die") or a plurality of semiconductor dies. A die is the smallest unit that may independently execute external commands or report status. Typically, a package or a chip with multiple dies is capable of simultaneously executing as many number of external commands as the total number of planes therein. Each die includes one or more planes. Identical concurrent operations may be executed in each plane within a same die, although there may be some restrictions. In case a die is a memory die, i.e., a die including memory elements, concurrent read operations, concurrent write operations, or concurrent erase operations may be performed in each plane within a same memory die. In a memory die, each plane contains a number of memory blocks (or "blocks"), which are the smallest unit that may be erased by in a single erase operation. Each memory block contains a number of pages, which are the smallest units that may be selected for programming. A page is also the smallest unit that may be selected to a read operation.

Referring to FIG. 1, a first exemplary structure according to the first embodiment of the present disclosure is illustrated. The first exemplary structure includes a substrate 9 which may be a semiconductor substrate. The substrate may include a substrate semiconductor layer 9 and an optional semiconductor material layer. The substrate semiconductor layer 9 may be a semiconductor wafer or a semiconductor material layer, and may include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate may have a major surface 7, which may be, for example, a topmost surface of the substrate semiconductor layer 9. The major surface 7 may be a semiconductor surface. In one embodiment, the major surface 7 may be a single crystalline semiconductor surface, such as a single crystalline semiconductor surface.

As used herein, a "semiconducting material" refers to a material having electrical conductivity in the range from $1.0 \times 10^{-5}$ S/m to $1.0 \times 10^{5}$ S/m. As used herein, a "semiconductor material" refers to a material having electrical conductivity in the range from $1.0 \times 10^{-5}$ S/m to 1.0 S/m in the absence of electrical dopants therein, and is capable of producing a doped material having electrical conductivity in a range from 1.0 S/m to $1.0 \times 10^{5}$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/m. As used herein, an "insulator material" or a "dielectric material" refers to a material having electrical conductivity less than $1.0 \times 10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^{5}$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-5}$ S/m to $1.0 \times 10^{5}$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

In one embodiment, at least one semiconductor device 700 for a peripheral circuitry may be formed on a portion of the substrate semiconductor layer 9. The at least one semiconductor device may include, for example, field effect transistors. If the at least one semiconductor device is employed for the peripheral circuitry, the at least one semiconductor device is herein referred to at least one peripheral device. For example, at least one shallow trench isolation structure 720 may be formed by etching portions of the substrate semiconductor layer 9 and depositing a dielectric material therein. A gate dielectric, at least one gate conductor layer, and a gate cap dielectric layer may be formed over the substrate semiconductor layer 9, and may be subsequently patterned to form at least one gate structure (750, 752, 754, 758), each of which may include a gate dielectric 750, a gate electrode (752, 754), and a gate cap dielectric 758. The gate electrode (752, 754) may include a stack of a first gate electrode portion 752 and a second gate electrode portion 754. At least one gate spacer 756 may be formed around the at least one gate structure (750, 752, 754, 758) by depositing and anisotropically etching a dielectric liner. Active regions 730 may be formed in upper portions of the substrate semiconductor layer 9, for example, by introducing electrical dopants employing the at least one gate structure (750, 752, 754, 758) as masking structures. Additional masks may be employed as needed. The active region 730 may include source regions and drain regions of field effect transistors. A first dielectric liner 761 and a second dielectric liner 762 may be optionally formed. Each of the first and second dielectric liners (761, 762) may comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 761 may be a silicon oxide layer, and the second dielectric liner 762 may be a silicon nitride layer. The least one semiconductor device for the peripheral circuitry may contain a driver circuit for memory devices to be subsequently formed.

A dielectric material such as silicon oxide may be deposited over the at least one semiconductor device, and may be subsequently planarized to form a planarization dielectric layer 770. In one embodiment the planarized top surface of the planarization dielectric layer 770 may be coplanar with a top surface of the dielectric liners (761, 762). Subsequently, the planarization dielectric layer 770 and the dielectric liners (761, 762) may be removed from an area to physically expose a top surface of the substrate semiconductor layer 9. As used herein, a surface is "physically exposed" if the surface is in physical contact with vacuum, or a gas phase material (such as air).

A bottom insulating layer 31 may be formed over the top surface 7 of the substrate 9 prior to, during, or after, formation of the at least one semiconductor device 700 by deposition of an insulating material, such as silicon oxide.

The region (i.e., area) of the at least one semiconductor device 700 is herein referred to as a peripheral device region 200. The region in which a memory array is subsequently formed is herein referred to as a memory array region 100. A staircase region 300 for subsequently forming stepped terraces of electrically conductive layers may be provided between the memory array region 100 and the peripheral device region 200. In an alternative embodiment, the at least one semiconductor device 700 is formed under the memory array region 100 in a CMOS under array ("CUA") configuration. In this case, the peripheral device region 200 may be omitted or used in combination with the CUA configuration. In another alternative embodiment, the at least one semiconductor device 700 may be formed on a separate substrate and then bonded to substrate 9 containing the memory array region 100.

Referring to FIG. 2, a sequence of material layers including two or more repetitions of a unit layer stack (42, 32A, 42, 32B) can be formed over the bottom insulating layer 31. The unit layer stack can include, from bottom to top, a first instance of a sacrificial material layer 42, a channel-level insulating layer 32A, a second instance of the sacrificial material layer 42, and an inter-transistor-level insulating layer 32B. The channel-level insulating layer 32A and the inter-transistor-level insulating layer 32B are herein collectively referred to as insulating layers 32.

An alternating plurality of insulating layers 32 and sacrificial material layers 42 is thus provided. As used herein, an alternating plurality of first elements and second elements refers to a structure in which instances of the first elements and instances of the second elements alternate. In this case, the insulating layers 32 and the sacrificial material layers 42 alternate within the alternating plurality of the insulating layers 32 and the sacrificial material layers. The alternating plurality of insulating layers 32 and sacrificial material layers 42 is herein referred to as an alternating stack (32, 42).

The channel-level insulating layers 32A include a first insulating material. In one embodiment, the first insulating material can include a doped silicate glass material such as borosilicate glass (BSG), borophosphosilicate glass (BPSG), or fluorosilicate glass, or an organosilicate glass material. The first insulating material can have a higher etch rate in 100:1 dilute hydrofluoric acid than undoped silicate glass. In one embodiment, the composition of the doped silicate glass material or the organosilicate glass material in the channel-level insulating layers 32A can have an etch rate in 100:1 dilute hydrofluoric acid that is greater than the etch rate of undoped silicate glass in 100:1 dilute hydrofluoric acid by a factor of at least 3, and/or at least 10. The thickness of each channel-level insulating layer 32A can be in a range from 10 nm to 60 nm, although lesser and greater thicknesses can also be employed.

The inter-transistor-level insulating layers 32B include a second insulating material. In one embodiment, the second insulating material can include a silicate glass material having a different composition than the dielectric material of the channel-level insulating layers 32A. In one embodiment, the second insulating material can include undoped silicate glass (i.e., undoped silicon oxide, such as silicon dioxide). In one embodiment, the first insulating material of the channel-level insulating layers 32A can have an etch rate in a 100:1 dilute hydrofluoric acid solution at 20 degrees Celsius that is at least three times an etch rate of the silicate glass material of the inter-transistor-level insulating layers 32B in the 100:1 dilute hydrofluoric acid solution at 20 degrees Celsius. The thickness of each inter-transistor-level insulating layer 32B can be in a range from 10 nm to 60 nm, although lesser and greater thicknesses can also be employed.

The sacrificial material layers 42 include a sacrificial material that can be removed selective to the materials of the insulating layers 32. Generally, the material of the sacrificial material layers 42 is a sacrificial material that may be removed selective to the material of the channel-level insulating layers 32A and selective to the material of the inter-transistor-level insulating layers 32B. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material. For example, the sacrificial material layers 42 can include silicon nitride, amorphous silicon, polysilicon, or a silicon-germanium alloy. In one embodiment, the sacrificial material layers 42 comprise, and/or consist essentially of, silicon nitride. The thickness of each sacrificial material layer 42 can be in a range from 15 nm to 60 nm, although lesser and greater thicknesses can also be employed.

The channel-level insulating layers 32A are a first subset of the insulating layers 32 on which vertical semiconductor channels are subsequently formed. The inter-transistor-level insulating layers 32B are a second subset of the insulating layers 32 which are disposed between vertically adjacent pairs of vertical field effect transistors.

In the illustrated example, the alternating stack (32, 42) of the insulating layers 32 and the sacrificial material layers 42 may begin with a bottommost sacrificial layer 42, which underlies a bottommost channel-level insulating layer 32A, and may terminate with a topmost sacrificial layer 42, which overlies a topmost channel-level insulating layer 32A. However, an alternative bottommost layer and/or an alternative topmost layer may be employed for the alternating stack (32, 42). The number of channel-level insulating layers 32A within the alternating stack (32, 42) may be in a range from 2 to 1,024, and typically from 8 to 256, although a greater number of repetitions may also be employed. In one embodiment, the alternating stack (32, 42) may include multiple repetition of a unit layer stack (42, 32A, 42, 43B) to provide a periodic structure that is repeated along the vertical direction.

An insulating cap layer 70 may be formed over the alternating stack (32, 42). The insulating cap layer 70 includes a dielectric material that is different from the material of the sacrificial material layers 42. In one embodiment, the insulating cap layer 70 may include a dielectric material that may be employed for the insulating layers 32 as described above. The insulating cap layer 70 may have a greater thickness than each of the insulating layers 32. The insulating cap layer 70 may be deposited, for example, by chemical vapor deposition. In one embodiment, the insulating cap layer 70 may be a silicon oxide layer.

Generally, the set of all insulating layers 32 within the alternating stack (32, 42) comprises a vertically alternating sequence of the channel-level insulating layers 32A and inter-transistor-level insulating layers 32B. In other words, if all the insulating layers 32 are selected from the alternating stack (32, 42), the insulating layers 32 include a vertically alternating sequence of the channel-level insulating layers 32A and inter-transistor-level insulating layers 32B. Each instance of the channel-level insulating layers 32A is formed as a horizontally-extending layer having a respective top surface and a respective bottom surface, and each instance of the inter-transistor-level insulating layers 32B is formed as a horizontally-extending layer having a respective top surface and a respective bottom surface. In one embodiment, each sacrificial material layer 42 other than a bottommost one of the sacrificial material layers 42 and other than a topmost one of the sacrificial material layers 42 contacts a respective overlying one of the insulating layers 32 and a respective underlying one of the insulating layers 32.

Referring to FIG. 3, stepped surfaces are formed at a peripheral region of the alternating stack (32, 42), which is herein referred to as a terrace region. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A stepped cavity is formed within the volume from which portions of the alternating stack (32, 42) are removed through formation of the stepped surfaces. A "stepped cavity" refers to a cavity having stepped surfaces.

The terrace region is formed in the staircase region 300, which is located between the memory array region 100 and the peripheral device region 200 containing the at least one semiconductor device for the peripheral circuitry. The stepped cavity may have various stepped surfaces such that the horizontal cross-sectional shape of the stepped cavity changes in steps as a function of the vertical distance from the top surface of the substrate 9. In one embodiment, the stepped cavity may be formed by repetitively performing a set of processing steps. The set of processing steps may include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Each sacrificial material layer 42 other than a topmost sacrificial material layer 42 within the alternating stack (32, 42) laterally extends farther than any overlying sacrificial material layer 42 within the alternating stack (32, 42) in the terrace region. The terrace region includes stepped surfaces of the alternating stack (32, 42) that continuously extend from a bottommost layer within the alternating stack (32, 42) to a topmost layer within the alternating stack (32, 42).

Each vertical step of the stepped surfaces may have the height of one or more pairs of an insulating layer 32 and a sacrificial material layer. In one embodiment, each vertical step may have the height of a single pair of an insulating layer 32 and a sacrificial material layer 42. In another embodiment, multiple "columns" of staircases may be formed along a first horizontal direction hd1 such that each vertical step has the height of a plurality of pairs of an insulating layer 32 and a sacrificial material layer 42, and the number of columns may be at least the number of the plurality of pairs. Each column of staircase may be vertically offset from each other such that each of the sacrificial material layers 42 has a physically exposed top surface in a respective column of staircases. In the illustrative example, two columns of staircases are formed for each block of memory stack structures to be subsequently formed such that one column of staircases provide physically exposed top surfaces for odd-numbered sacrificial material layers 42 (as counted from the bottom) and another column of staircases provide physically exposed top surfaces for even-numbered sacrificial material layers (as counted from the bottom). Configurations employing three, four, or more columns of staircases with a respective set of vertical offsets of the physically exposed surfaces of the sacrificial material layers 42 may also be employed. Each sacrificial material layer 42 has a greater lateral extent, at least along one direction, than any overlying sacrificial material layers 42 such that each physically exposed surface of any sacrificial material layer 42 does not have an overhang. In one embodiment, the vertical steps within each column of staircases may be arranged along the first horizontal direction hd1, and the columns of staircases may be arranged along a second horizontal direction hd2 that is perpendicular to the first horizontal direction hd1. In one embodiment, the first horizontal direction hd1 may be perpendicular to the boundary between the memory array region 100 and the staircase region 300.

A retro-stepped dielectric material portion 65 (i.e., an insulating fill material portion) may be formed in the stepped cavity by deposition of a dielectric material therein. For example, a dielectric material such as silicon oxide may be deposited in the stepped cavity. Excess portions of the deposited dielectric material may be removed from above the top surface of the insulating cap layer 70, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Figure 4B:
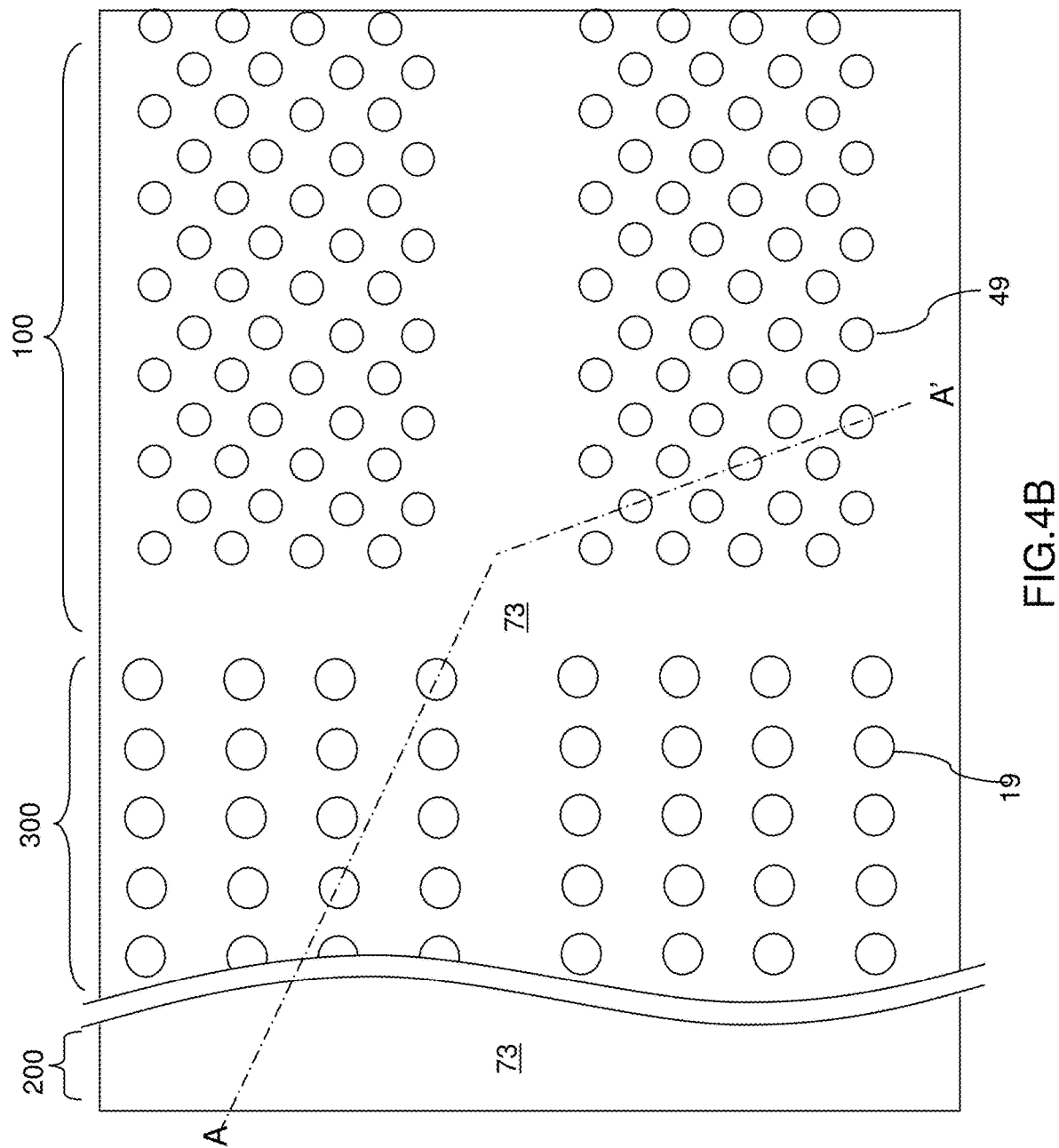
FIG. 4B is a top-down view of the first exemplary structure of FIG. 4A. The vertical plane A-A' is the plane of the cross-section for FIG. 4A.

Referring to FIGS. 4A and 4B, a lithographic material stack (not shown) including at least a photoresist layer may be formed over the insulating cap layer 70 and the retro-stepped dielectric material portion 65, and may be lithographically patterned to form openings therein. The openings include a first set of openings formed over the memory array region 100 and a second set of openings formed over the staircase region 300. The pattern in the lithographic material stack may be transferred through the insulating cap layer 70 or the retro-stepped dielectric material portion 65, and through the alternating stack (32, 42) by at least one anisotropic etch that employs the patterned lithographic material stack as an etch mask. Portions of the alternating stack (32, 42) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the insulating cap layer 70 and the entirety of the alternating stack (32, 42) in the memory array region 100. The support openings 19 are formed through the retro-stepped dielectric material portion 65 and the portion of the alternating stack (32, 42) that underlie the stepped surfaces in the staircase region 300.

The memory openings 49 extend through the entirety of the alternating stack (32, 42). The support openings 19 extend through a subset of layers within the alternating stack (32, 42). The chemistry of the anisotropic etch process employed to etch through the materials of the alternating stack (32, 42) may alternate to optimize etching of the first and second materials in the alternating stack (32, 42). The anisotropic etch may be, for example, a series of reactive ion etches. The sidewalls of the memory openings 49 and the support openings 19 may be substantially vertical, or may be tapered. The patterned lithographic material stack may be subsequently removed, for example, by ashing.

The memory openings 49 and the support openings 19 may extend from the top surface of the alternating stack (32, 42) to a respective bottom surface located within the bottom insulating layer 31. Each of the memory openings 49 and the support openings 19 may include a sidewall (or a plurality of sidewalls) that extends substantially perpendicular to the topmost surface of the substrate. A two-dimensional array of memory openings 49 may be formed in the memory array region 100. A two-dimensional array of support openings 19 may be formed in the staircase region 300.

Figure 5:
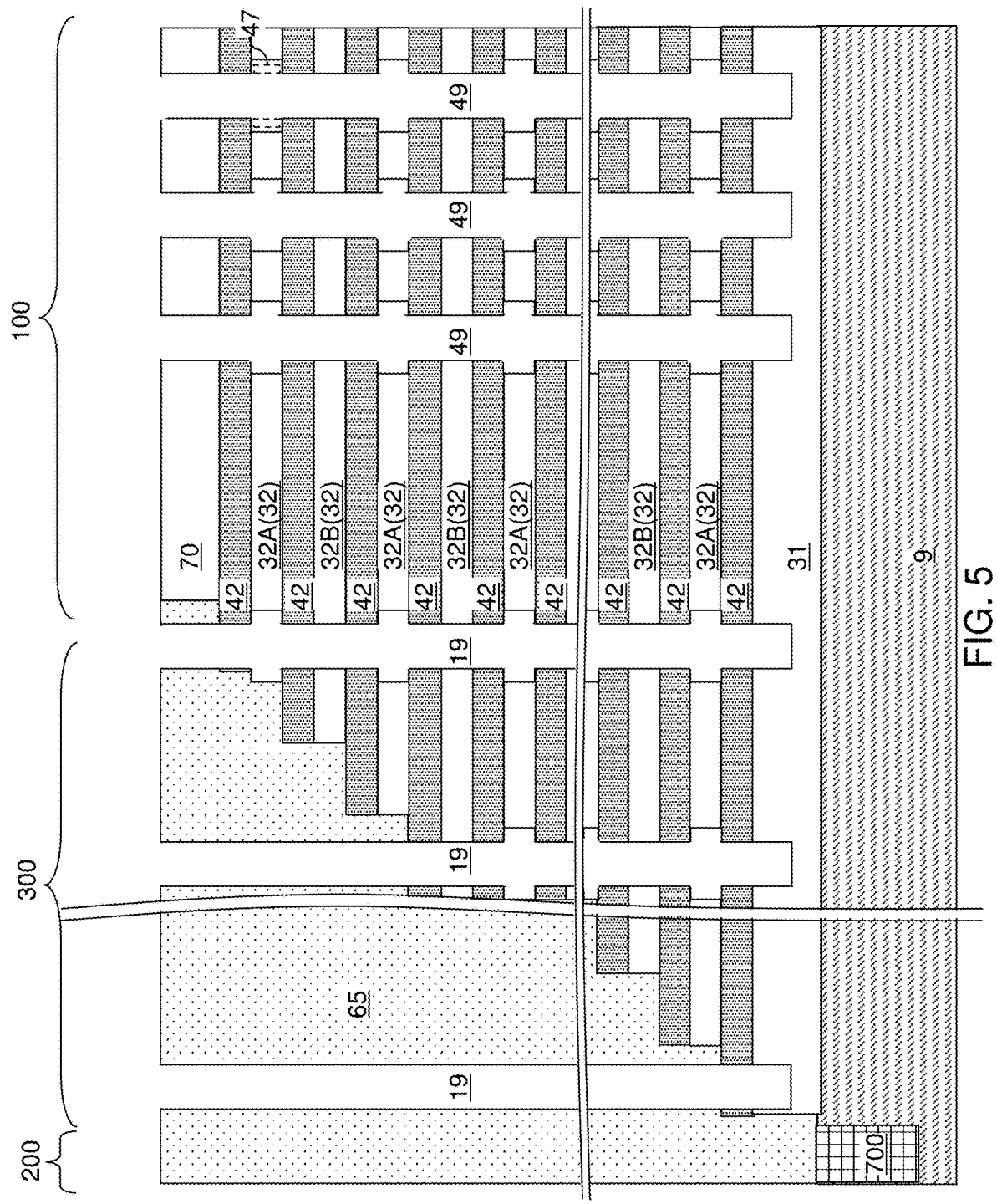
FIG. 5 is a schematic vertical cross-sectional view of the first exemplary structure after laterally recessing channel-level insulating layers selective to inter-transistor-level insulating layers and sacrificial material layers according to the first embodiment of the present disclosure.

Referring to FIG. 5, an isotropic etch process can be performed to laterally recess physically exposed cylindrical sidewalls of the channel-level insulating layers 32A selective to the materials of the sacrificial material layers 42 and the inter-transistor-level insulating layers 32B. For example, if the sacrificial material layers 42 include silicon nitride, the inter-transistor-level insulating layers 32B include undoped silicate glass, and the channel-level insulating layers include a doped silicate glass or organosilicate glass, a wet etch process employing a dilute hydrofluoric acid at a dilution of 100:1 or at a higher dilution can be performed to laterally recess the physically exposed sidewalls of the channel-level insulating layers 32A. The lateral recess distance of the sidewalls of the channel-level insulating layers 32A can be greater than the lateral recess distance of the sidewalls of the inter-transistor-level insulating layers 32B by a factor of at least three, and/or by a factor of at least 10, such as a factor of 100 or greater.

Optionally, another isotropic etch process may be performed to recess the sidewalls of the sacrificial material layers 42 so that the recessed sidewalls of the sacrificial material layers 42 are approximately vertically coincident with the sidewalls of the inter-transistor-level insulating layers 32B. A vertical stack of annular cylindrical cavities 47 can be formed around each memory opening 49 in the memory array region 100. Each annular cylindrical cavity 47 can have an outer boundary that coincides with a recessed sidewall of a channel-level insulating layer 32A and an inner boundary that coincides with a cylindrical vertical plane that includes sidewalls of the sacrificial material layers 42 around a respective memory opening 49. The lateral recess distance between the sidewalls of the channel-level insulating layers 32A and the sidewalls of the sacrificial material layers 42 can be in a range from 3 nm to 40 nm, such as from 5 nm to 20 nm, although lesser and greater recess distances can also be employed.

Figure 6:
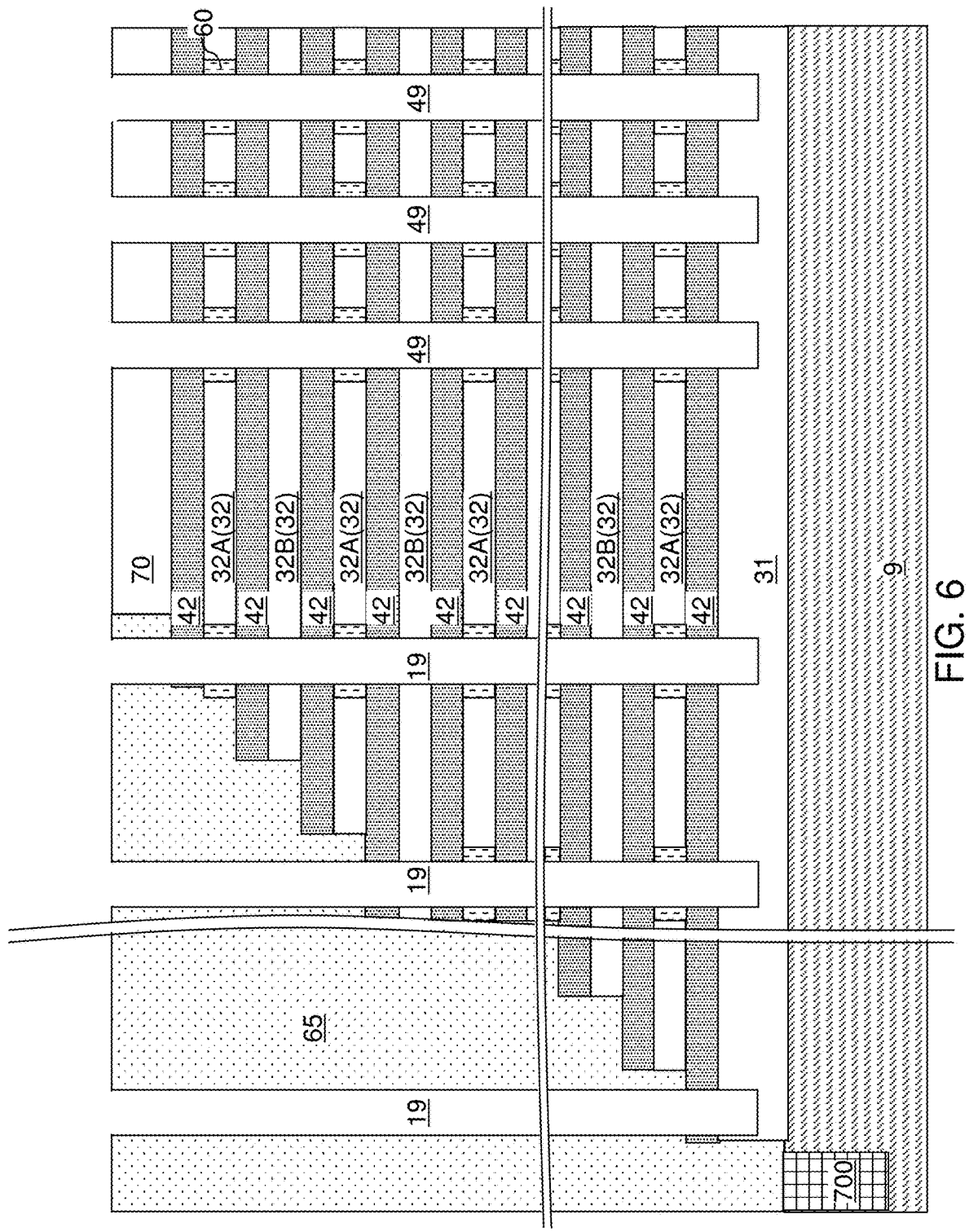
FIG. 6 is a schematic vertical cross-sectional view of the first exemplary structure after formation of semiconductor channels having a tubular configuration according to the first embodiment of the present disclosure.

Referring to FIG. 6, a semiconductor material such as amorphous silicon or polysilicon can be conformally deposited in the annular cylindrical cavities 47 formed by lateral recessing of the channel-level insulating layers 32A. The semiconductor material can have a doping of a first conductivity type, which may be p-type or n-type. The atomic concentration of dopants of the first conductivity type in the semiconductor material can be in a range from $1.0 \times 10^{14}/cm^3$ to $1.0 \times 10^{18}/cm^3$, although lesser and greater dopant concentrations can also be employed. The thickness of the conformally deposited semiconductor material can be selected such that the entire volume of each annular cylindrical cavity 47 is filled with the semiconductor material. An anisotropic etch that etches the semiconductor material selective to the insulating materials of the insulating cap layer 70 and the bottom insulating layer 31 can be performed to remove portions of the semiconductor material that are not masked by the insulating cap layer 70. Each remaining tubular portion of the semiconductor material that fills a respective annular cylindrical cavity 47 constitutes a semiconductor channel 60. Each semiconductor channel 60 can have a tubular shape.

Each instance of the semiconductor channel 60 can be formed on a sidewall of a respective instance of the channel-level insulating layer 32A. In one embodiment, each semiconductor channel 60 can have a cylindrical outer sidewall and an inner cylindrical sidewall that is laterally offset inward from the cylindrical outer sidewall by a uniform lateral offset distance, which can be the same as the lateral offset distance of the isotropic etch process that forms the recessed sidewalls of the channel-level insulating layers 32A at the processing steps of FIG. 5. In one embodiment, each semiconductor channel 60 can have an annular planar top surface and an annular planar bottom surface. The outer peripheries of the annular planar top surface and the annular planar bottom surface of a semiconductor channel 60 are adjoined to an upper periphery and a lower periphery of a cylindrical outer sidewall of the semiconductor channel 60. The inner peripheries of the annular planar top surface and the annular planar bottom surface of a semiconductor channel 60 are adjoined to an upper periphery and a lower periphery of a cylindrical inner sidewall of the semiconductor channel 60. The height of each semiconductor channel 60 can be the same as the thickness of the channel-level insulating layer 32A that a cylindrical outer sidewall of the semiconductor channel 60 contacts.

Figure 7A:
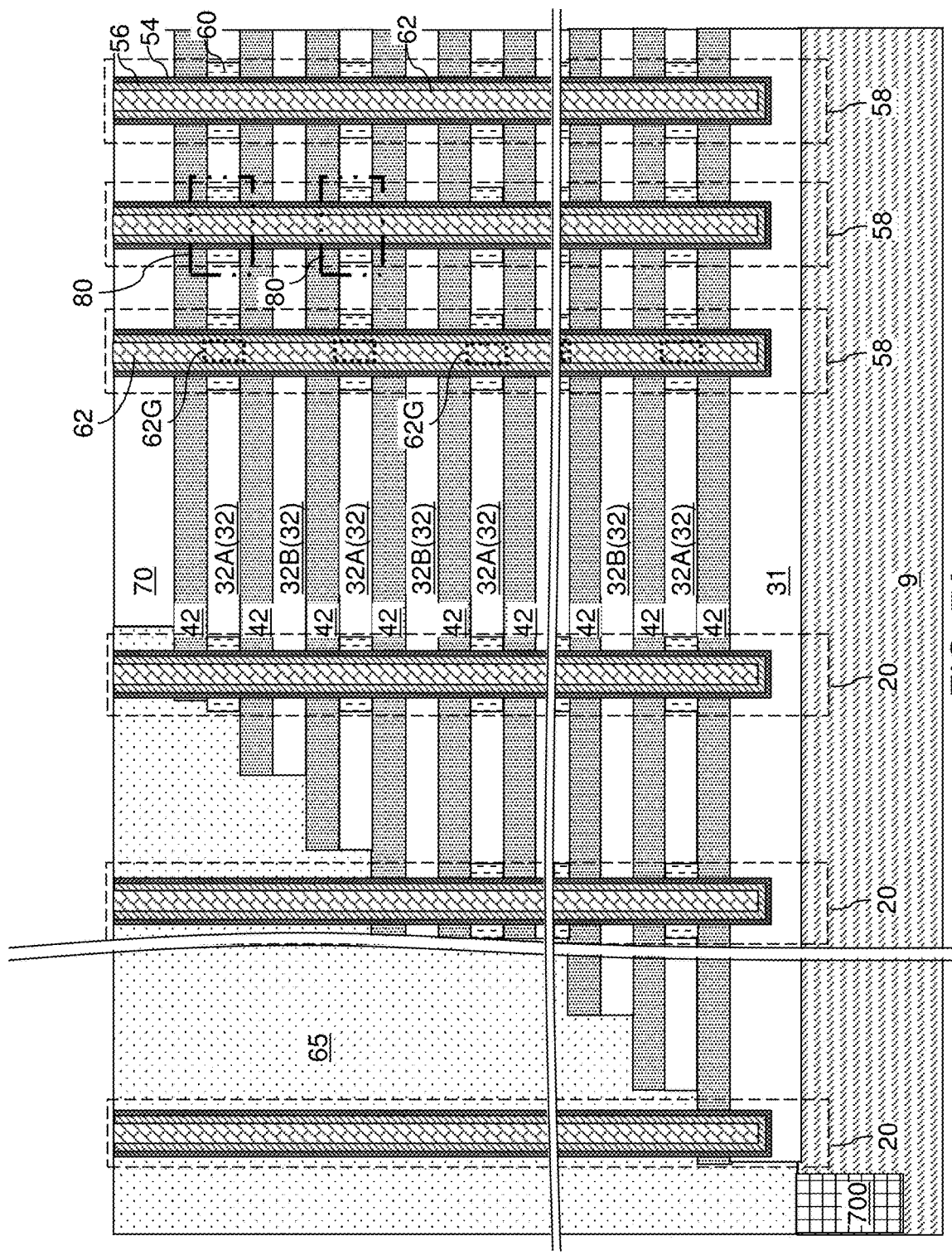
FIG. 7A is a schematic vertical cross-sectional view of the first exemplary structure after formation of a layer stack including, from one side to another, a gate dielectric layer, a selector material layer, and a word line in each memory opening according to the first embodiment of the present disclosure.
Figure 7B:
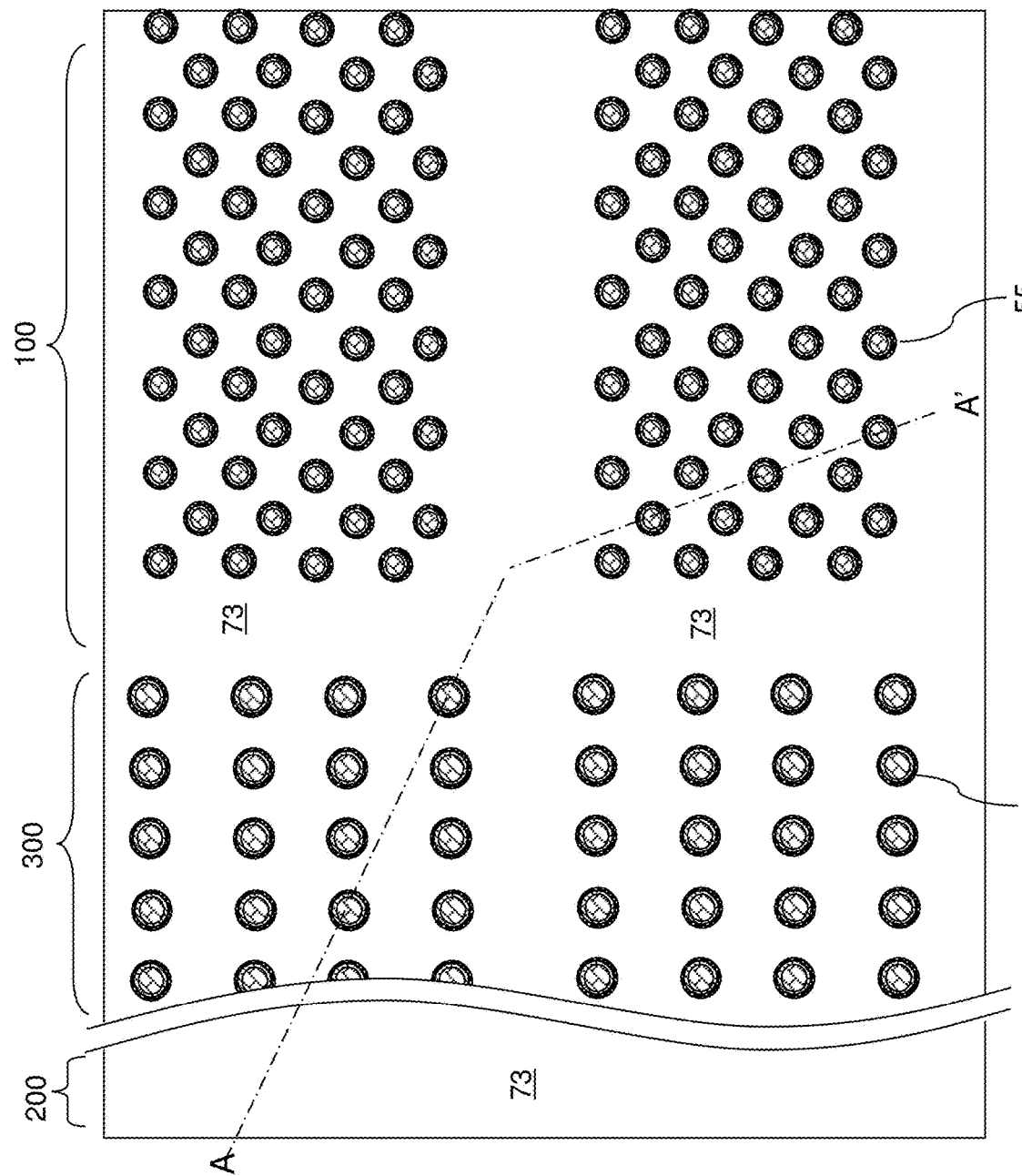
FIG. 7B is a top-down view of the first exemplary structure of FIG. 7A. The vertical plane A-A' is the plane of the cross-section for FIG. 7A.

Referring to FIGS. 7A and 7B, a gate dielectric layer 54 is formed on inner sidewalls of each semiconductor channel 60 within a vertical stack of semiconductor channels around each memory opening 49. The gate dielectric layer 54 can be formed directly on physically exposed cylindrical sidewalls of the sacrificial material layers 42 and the inter-transistor-level insulating layers 32B. The gate dielectric layer 54 vertically extends as a continuous material layer from a bottommost one of the sacrificial material layers 42 to a topmost one of the sacrificial material layers 42 within each memory opening 49, and directly contacts sidewalls of each of the inter-transistor-level insulating layers 32B. The gate dielectric layer 54 is laterally spaced from each of the channel-level insulating layers 32 by a respective vertical stack of semiconductor channels 54 located around each memory opening 49.

The gate dielectric layer 54 includes a ferroelectric material. In one embodiment, the gate electric layer 54 consists essentially of only the ferroelectric material. In another embodiment, the gate dielectric layer 54 comprises a multi-film stack of a ferroelectric material film and a non-ferroelectric dielectric material film (e.g., silicon oxide film). As used herein, a "ferroelectric material" refers to a crystalline material that exhibits spontaneous electrical polarization in the absence of an external electric field. The ferroelectric material in the gate dielectric layer 54 may be an insulating ferroelectric material. In one embodiment, the gate dielectric layer 54 comprises a hafnium oxide layer including at least one dopant selected from Al, Zr, and Si and having a ferroelectric non-centrosymmetric orthorhombic phase. Alternatively, other ferroelectric materials, such as barium titanate, bismuth ferrite, lead titanate, lead zirconate titanate, etc., may be used. The gate dielectric layer 54 may have a thickness in a range from 1.5 nm to 15 nm, such as from 3 nm to 10 nm, although lesser and greater thicknesses can also be employed. In one embodiment, the gate dielectric layer 54 can be deposited by a conformal deposition process such as chemical vapor deposition (CVD) or atomic layer deposition (ALD).

A bipolar selector material layer 56 is subsequently formed on the gate dielectric layer 54 as a conformal material layer. As used herein, a "bipolar selector material" refers to any material that can function as an on/off switch depending on the magnitude of the applied bias voltage thereacross without switching bias polarity dependence (i.e., the material switches under either positive or negative voltage if the absolute value of the voltage is greater than a threshold value). The selector material layer can include a non-Ohmic material that provides electrical connection of electrical isolation depending on the magnitude of an externally applied voltage bias thereacross. In one embodiment, the selector material layer includes at least one threshold switch material layer. The at least one threshold switch material layer includes any suitable threshold switch material which exhibits non-linear electrical behavior, such as an ovonic threshold switch (OTS) material.

As used herein, an ovonic threshold switch is a device that does not crystallize in a low resistivity state under a voltage above the threshold voltage, and reverts back to a high resistivity state when not subjected to a voltage above a critical holding voltage across the OTS material layer. As used herein, an "ovonic threshold switch material" refers to a material that displays a non-linear resistivity curve under an applied external bias voltage such that the resistivity of the material decreases with the magnitude of the applied external bias voltage. In other words, an ovonic threshold switch material is non-Ohmic, and becomes more conductive under a higher external bias voltage than under a lower external bias voltage.

An ovonic threshold switch material (OTS material) can be non-crystalline (for example, amorphous) in a high resistivity state, and can remain non-crystalline (for example, remain amorphous) in a low resistivity state during application of a voltage above its threshold voltage across the OTS material. The OTS material can revert back to the high resistivity state when the high voltage above its threshold voltage is lowered below a critical holding voltage. Throughout the resistivity state changes, the ovonic threshold switch material can remain non-crystalline (e.g., amorphous).

In one embodiment, the ovonic threshold switch material can comprise a chalcogenide material which exhibits hysteresis in both the write and read current polarities. The chalcogenide material may be a GeTe compound or a Ge—Se compound doped with a dopant selected from As, N, and C, such as a Ge—Se—As compound semiconductor material. The ovonic threshold switch material layer can contain any ovonic threshold switch material. In one embodiment, the ovonic threshold switch material layer can include a compound of at least one Group 14 elements and at least one Group 16 element. In one embodiment, the ovonic threshold switch material layer can include, and/or can consist essentially of, a material selected from a GeSeAs alloy, a GeTeAs, a GeSeTeSe alloy, a GeSe alloy, a SeAs alloy, a GeTe alloy, and a SiTe alloy.

In one embodiment, the material of the selector material layer can be selected such that the resistivity of the selector material therein decreases at least by two orders of magnitude (i.e., by more than a factor of 100) upon application of an external bias voltage that exceeds a critical bias voltage magnitude (also referred to as threshold voltage). In one embodiment, the composition and the thickness of the selector material layer can be selected such that the critical bias voltage magnitude can be in a range from 1 V to 6 V, although lesser and greater voltages can also be employed for the critical bias voltage magnitude. The thickness of the selector material layer can be, for example, in a range from 1 nm to 50 nm, such as from 5 nm to 25 nm, although lesser and greater thicknesses can also be employed.

A conductive material can be deposited in each remaining unfilled volume of the memory openings 49 and the support openings. The conductive material can include at least one metallic material and/or a heavily doped semiconductor material. For example, the conductive material can include an optional conductive metallic nitride liner (such as a TiN liner, a TaN liner, or a WN liner) and a metal fill material (such as tungsten).

Excess portions of the conductive material, the selector material layer 56, and the gate dielectric layer 54 can be removed from above a horizontal plane including the top surface of the insulating cap layer 70 by a planarization process, which can employ at least one recess etch process and/or a chemical mechanical planarization (CMP) process. The top surface of the insulating cap layer 70 can be employed as the stopping layer for the at least one recess etch process and/or the CMP process. Each remaining portion of the conductive material in the memory openings 49 and the support openings 19 constitutes a word line 62. Portions of each word line 62 located at the level of each semiconductor channel comprise gate electrodes 62G of respective vertical field effect transistors 80.

A layer stack including, from one side to another, a gate dielectric layer 54, a selector material layer 56, and a word line 62 can be formed on a respective vertical stack of semiconductor channels 60 within each memory opening 49. Each vertical stack of semiconductor channels 60 surrounds a respective one of the memory openings 49, and contacts each of the channel-level insulating layers 32A. The gate dielectric layer 54 comprises a ferroelectric dielectric material, and the selector material layer 56 comprises a bipolar switching material providing a voltage magnitude dependent switching characteristic.

Each gate dielectric layer 54 comprises a tubular gate dielectric portion extending through each layer of the alternating stack (32, 42) and a bottom gate dielectric base portion adjoined to a bottom periphery of the tubular gate dielectric portion. Each selector material layer 56 is laterally surrounded by the tubular gate dielectric portion and comprises a tubular selector material portion extending through each layer of the alternating stack (32, 42) and a bottom selector material base portion adjoined to a bottom periphery of the tubular selector material portion. Each word line 62 is laterally surrounded by the tubular selector material portion of a respective selector material layer 56, and extends through each layer within the alternating stack (32, 42). Each of the semiconductor channels 60, the gate dielectric layers 54, the selector material layers 56, and the word lines 62 extend along a vertical direction.

Each combination of gate dielectric layer 54, the selector material layer 56 and the word line 62 that fills a memory opening 49 and an adjoining vertical stack of semiconductor channels 60 together constitute a memory opening fill structure 58. Each combination of all material portions that fills a support opening 19 and an adjoining vertical stack of semiconductor channels 60 constitutes a support pillar structure. Two-dimensional arrays of memory opening fill structures 58 can be formed in the memory array region 100. Array of support pillar structures 20 can be formed in the staircase region 300. The semiconductor channels 60 are not present on portions of the support pillar structures 20 that extend through the retro-stepped dielectric material portion 65.

Figure 8A:
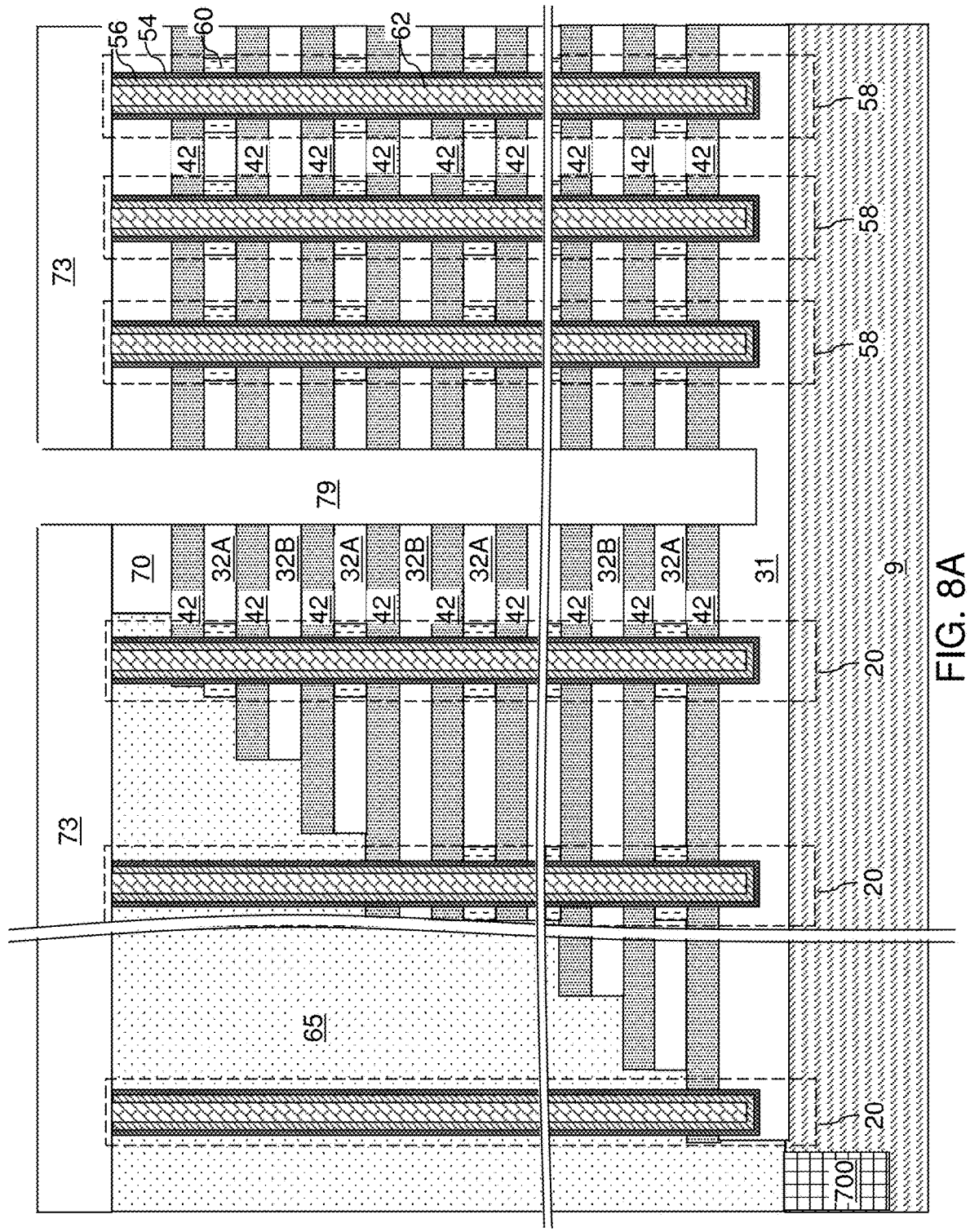
FIG. 8A is a schematic vertical cross-sectional view of the first exemplary structure after formation of a contact-level dielectric layer and backside trenches according to the first embodiment of the present disclosure.
Figure 8B:
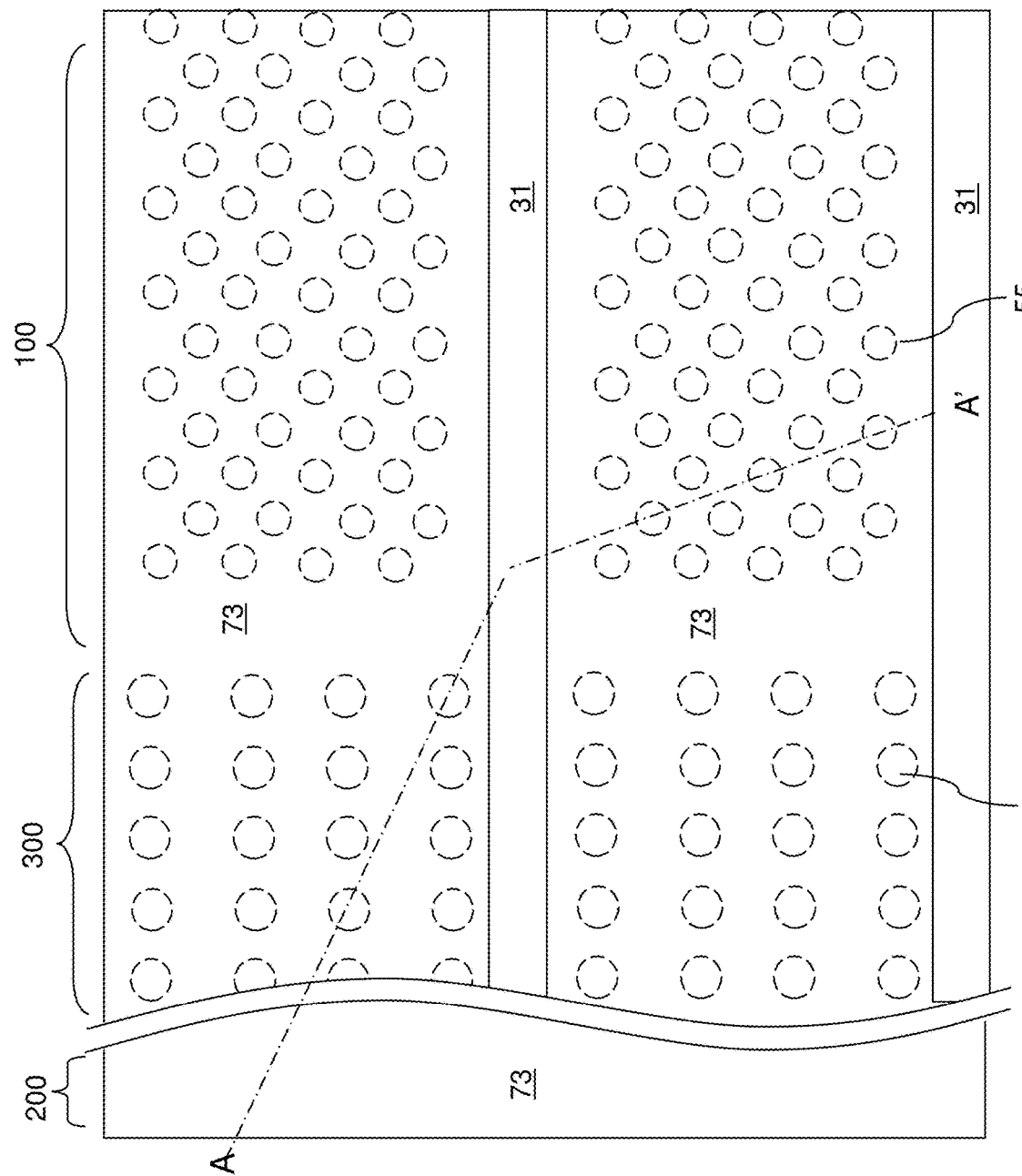
FIG. 8B is a partial see-through top-down view of the first exemplary structure of FIG. 8A. The vertical plane A-A' is the plane of the schematic vertical cross-sectional view of FIG. 8A.

Referring to FIGS. 8A and 8B, a contact level dielectric layer 73 may be formed over the alternating stack {(32A, 32B), 42} of insulating layer (32A, 32B) and sacrificial material layers 42, and over the memory opening fill structures 58 and the support pillar structures 20. The contact level dielectric layer 73 includes a dielectric material that is different from the dielectric material of the sacrificial material layers 42. For example, the contact level dielectric layer 73 may include silicon oxide. The contact level dielectric layer 73 may have a thickness in a range from 50 nm to 500 nm, although lesser and greater thicknesses may also be employed.

A photoresist layer (not shown) may be applied over the contact level dielectric layer 73, and is lithographically patterned to form openings in areas between clusters of memory opening fill structures 58. The pattern in the photoresist layer may be transferred through the contact level dielectric layer 73, the alternating stack {(32A, 32B), 42} and/or the retro-stepped dielectric material portion 65 employing an anisotropic etch to form backside trenches 79, which vertically extend from the top surface of the contact level dielectric layer 73 down to the bottom insulating layer 31, and laterally extend through the memory array region 100 and the staircase region 300.

In one embodiment, the backside trenches 79 may laterally extend along a first horizontal direction hd1 and may be laterally spaced apart from each other along a second horizontal direction hd2 that is perpendicular to the first horizontal direction hd1. The memory opening fill structures 58 may be arranged in rows that extend along the first horizontal direction hd1. Each backside trench 79 may have a uniform width that is invariant along the lengthwise direction (i.e., along the first horizontal direction hd1). The photoresist layer may be removed, for example, by ashing.

Figure 9:
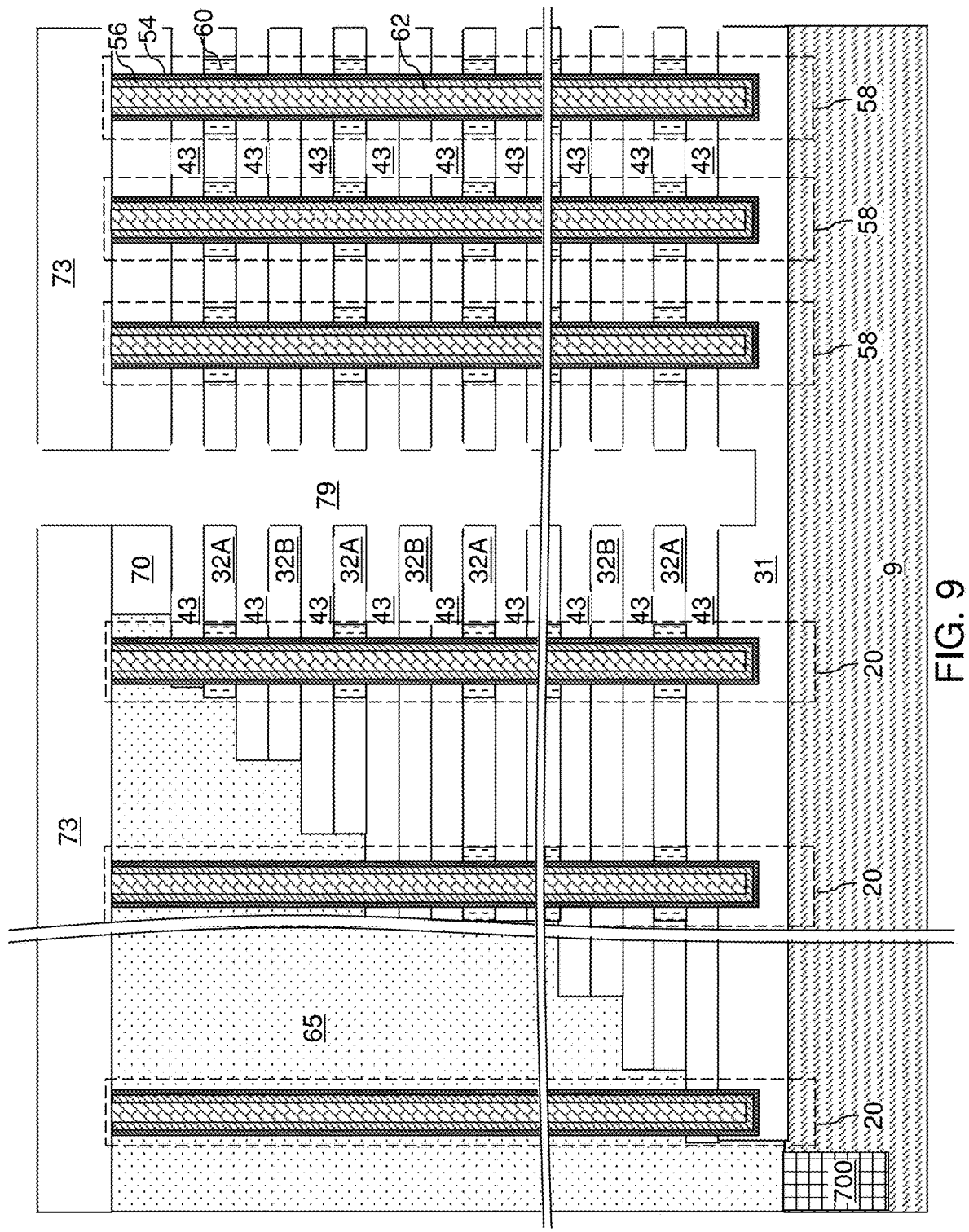
FIG. 9 is a schematic vertical cross-sectional view of the first exemplary structure after formation of backside recesses according to the first embodiment of the present disclosure.

Referring to FIG. 9, an etchant that selectively etches the sacrificial material layers 42 with respect to the insulating layers (32A, 32B) may be introduced into the backside trenches 79, for example, employing an etch process. Backside recesses 43 are formed in volumes from which the sacrificial material layers 42 are removed. The removal of the sacrificial material layers 42 may be selective to the insulating layers (32A, 32B), the material of the retro-stepped dielectric material portion 65, and the material of the gate dielectric layers 54. In one embodiment, the sacrificial material layers 42 may include silicon nitride, and the materials of the insulating layers (32A, 32B) and the retro-stepped dielectric material portion 65 may be selected from silicon oxide and dielectric metal oxides.

The etch process that removes the sacrificial material layers 42 selective to the insulating layers (32A, 32B) and the gate dielectric layers 54 may be a wet etch process employing a wet etch solution, or may be a gas phase (dry) etch process in which the etchant is introduced in a vapor phase into the backside trenches 79. For example, if the sacrificial material layers 42 include silicon nitride, the etch process may be a wet etch process in which the first exemplary structure is immersed within a wet etch tank including phosphoric acid, which etches silicon nitride selective to silicon oxide, silicon, and various other materials employed in the art. The support pillar structure 20, the retro-stepped dielectric material portion 65, and the memory opening fill structures 58 provide structural support while the backside recesses 43 are present within volumes previously occupied by the sacrificial material layers 42.

Each backside recess 43 may be a laterally extending cavity having a lateral dimension that is greater than the vertical extent of the cavity. In other words, the lateral dimension of each backside recess 43 may be greater than the height of the backside recess 43. A plurality of backside recesses 43 may be formed in the volumes from which the sacrificial material layers 42 are removed. The memory openings 49 in which the memory opening fill structures 58 are formed are herein referred to as front side openings or front side cavities in contrast with the backside recesses 43.

Each of the plurality of backside recesses 43 may extend substantially parallel to the top surface of the substrate 9. A backside recess 43 may be vertically bounded by a top surface of an underlying insulating layer (32A, 32B) and a bottom surface of an overlying insulating layer (32A, 32B). In one embodiment, each backside recess 43 may have a uniform height throughout.

Figure 10:
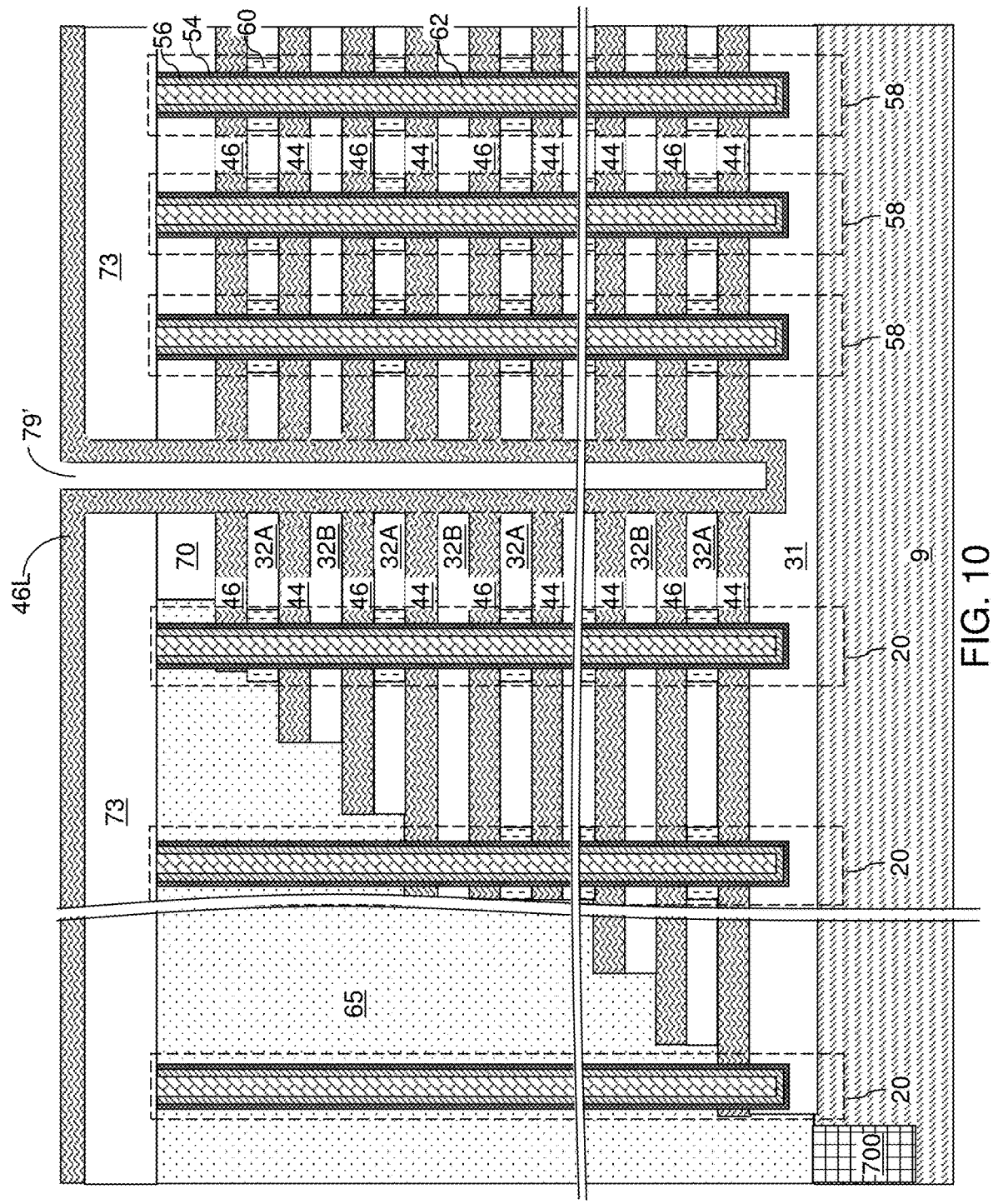
FIG. 10 is a schematic vertical cross-sectional view of the first exemplary structure after formation of doped semiconductor layers according to the first embodiment of the present disclosure.

Referring to FIG. 10, a doped semiconductor material can be deposited in the backside recesses 43. The semiconductor material can have a doping of a second conductivity type, which is the opposite of the first conductivity type. For example, if the first conductivity type is p-type, the second conductivity type is n-type, and vice versa. The atomic concentration of dopants of the second conductivity type in the semiconductor material can be in a range from $5.0 \times 10^{19}/cm^3$ to $2.0 \times 10^{21}/cm^3$, although lesser and greater dopant concentrations can also be employed. A plurality of doped semiconductor layers (44, 46) can be formed in the backside recesses. The plurality of doped semiconductor layers (44, 46) include source layers 44 that contact first annular horizontal surfaces of the semiconductor channels 60 and drain layers 46 that contact second annular horizontal surfaces of the semiconductor channels 60. The source layers 44 function as a source doping region of a respective vertical field effect transistor, and the drain layers 46 function as a drain doping region of a respective vertical field effect transistor.

Generally, doped semiconductor regions of the source layers and the drain layers contacting end portions of a semiconductor channel 60 can function as a source region or as a drain region of each vertical field effect transistor 80 depending on the voltage bias scheme and the polarity of the minority charge carriers that flow through the semiconductor channel. Thus, while the present disclosure is described employing an embodiment in which a source layer 44 are formed at a bottom end of each semiconductor channel 60 and a drain layer 46 is formed at a top end of each semiconductor channel, it is understood that the positions of the source layer 44 and the drain layer 46 contacting any semiconductor channel 60 may be reversed depending on the voltage bias scheme that is employed across the source layer 44 and the drain layer 46.

In the illustrated example, each annular bottom surface of a semiconductor channel 60 is contacted by a source layer 44, and each annular top surface of a semiconductor channel 60 is contacted by a drain layer 46. Each source layer 44 contacts annular bottom surfaces of a two-dimensional array of semiconductor channels 60 having a respective cylindrical sidewall that contacts a respective one of the channel-level insulating layer 32A. Each drain layer 46 contacts annular top surfaces of a two-dimensional array of semiconductor channels 60 having a respective cylindrical sidewall that contacts a respective one of the channel-level insulating layer 32A. Each portion of a source layer 44 that contacts, and/or is proximal to, an end portion of a semiconductor channel 60 constitutes a source region. Each portion of a drain layer 46 that contacts, and/or is proximal to, an end portion of a semiconductor channel 60 constitutes a drain region. Each sacrificial material layer 42 may be replaced with a source layer 44 or a drain layer 46.

A continuous doped semiconductor layer 46L may be formed on the sidewalls of each backside trench 79 and over the contact level dielectric layer 73. The continuous doped semiconductor layer 46L includes a continuously extending portion of the doped semiconductor material that is deposited in the backside trenches 79 or above the contact level dielectric layer 73. A backside cavity 79' is present in the portion of each backside trench 79 that is not filled with the continuous doped semiconductor layer 46L.

Figure 11:
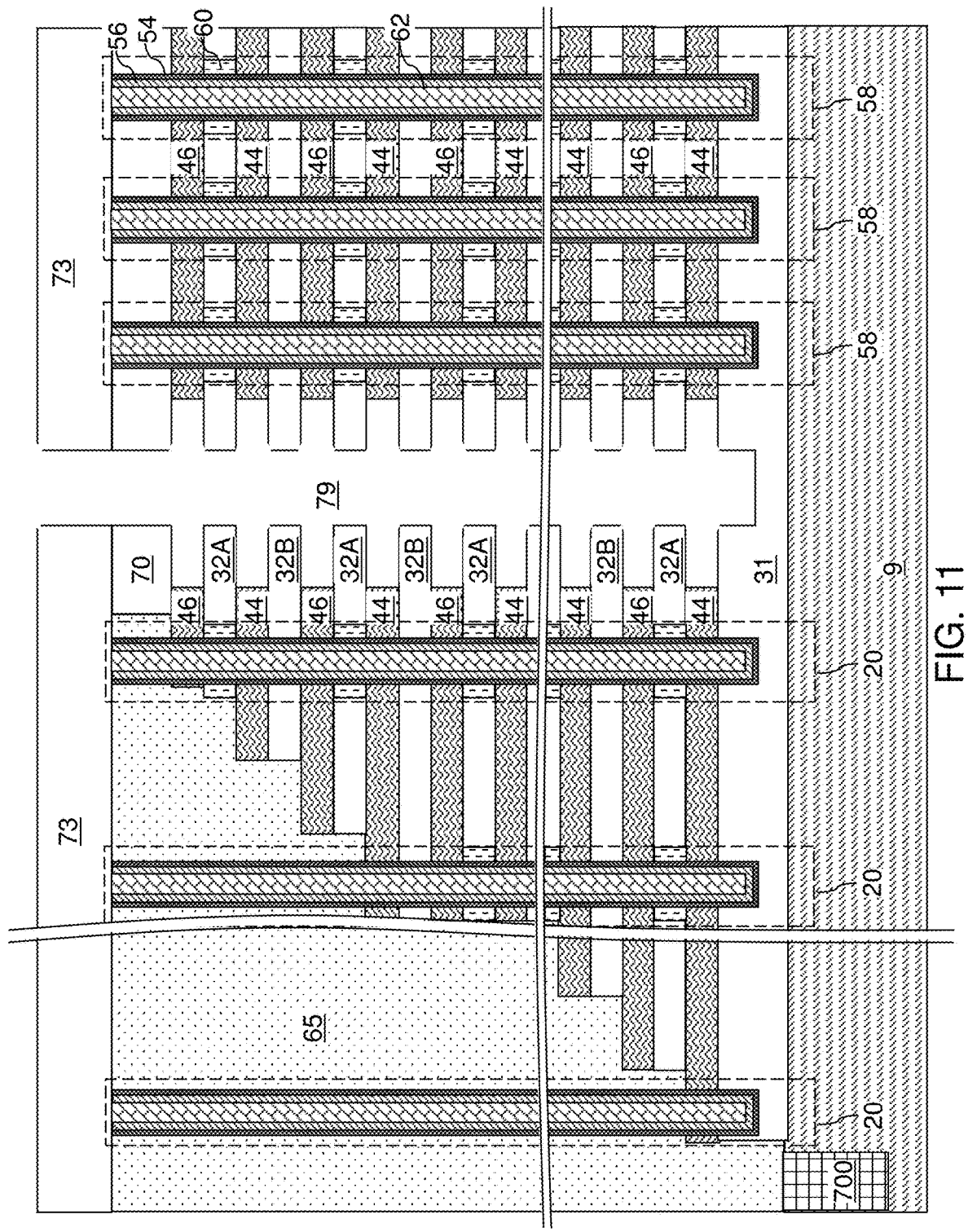
FIG. 11 is a schematic vertical cross-sectional view of the first exemplary structure after lateral recessing of the doped semiconductor layers according to the first embodiment of the present disclosure.

Referring to FIG. 11, the continuous doped semiconductor layer 46L is etched back from the sidewalls of each backside trench 79 and from above the contact level dielectric layer 73, for example, by an isotropic wet etch, an anisotropic dry etch, or a combination thereof. Each remaining portion of the doped semiconductor material in the backside recesses 43 constitutes a source layer 44 or a drain layer 46. In one embodiment, the doped semiconductor material of the source layers 44 and the drain layers 46 can be isotropically etched back, for example, employing a wet etch process that etches the doped semiconductor material selective to the materials of the insulating layers (32A, 32B), the bottom insulating layer 31, the insulating cap layer 70, and the contact-level dielectric layer 73. In an illustrative example, a wet etch process using hot trimethyl-2 hydroxyethyl ammonium hydroxide ("hot TMY") or tetramethyl ammonium hydroxide (TMAH) may be performed to laterally recess the sidewalls of the source layers 44 and the drain layers 46 from the backside trenches 79. Alternatively, the doped semiconductor material of the source layers 44 and the drain layers 46 is not isotropically etched back.

The lateral recess distance of the sidewalls of the source layers 44 and the drain layers 46 can be controlled such that surfaces of the semiconductor channels 60 are not physically exposed, and each semiconductor channel 60 is spaced from the volumes of the recesses around the backside trenches 79 at least by a respective source region (a region of a source layer 44) and by a respective drain region (a region of a drain layer 46). In one embodiment, the lateral recess distance of the sidewalls of the source layers 44 and the drain layers 46 around each backside trench 79 can be in a range from 20 nm to 100 nm, although lesser and greater lateral recess distances can also be employed.

Figure 12:
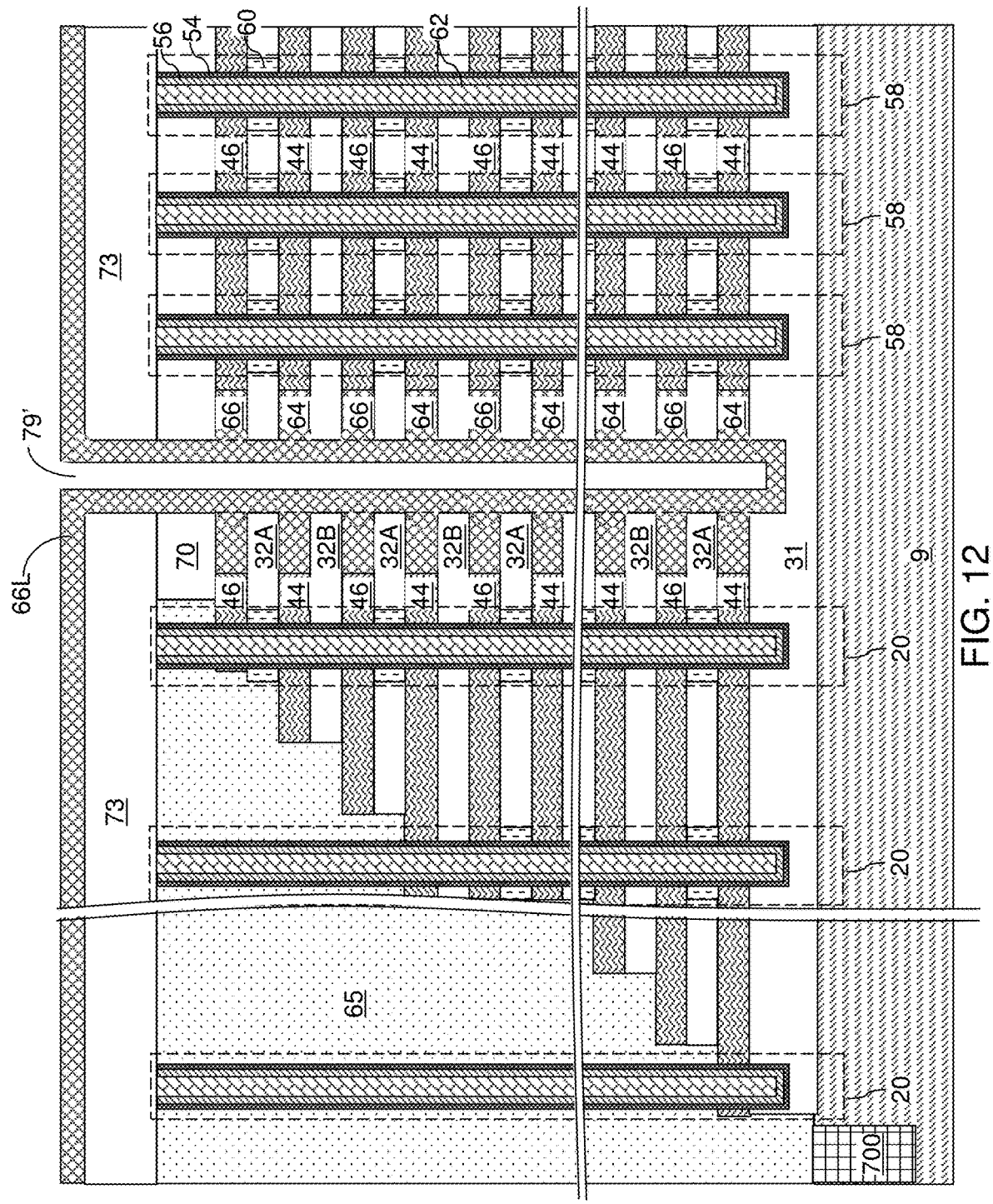
FIG. 12 is a schematic vertical cross-sectional view of the first exemplary structure after conformal deposition of a metallic material according to the first embodiment of the present disclosure.

Referring to FIG. 12, at least one metallic material can be deposited in the lateral recesses around the backside trenches 79, at peripheral regions of the backside trenches 79, and over the contact-level dielectric layer 73. The at least one metallic material can include a metallic barrier liner material and a metallic fill material. The metallic barrier liner material can include a conductive metallic nitride material such as TiN, TaN, WN, or a stack thereof. In one embodiment, the metallic barrier liner material may be deposited by a conformal deposition process such as chemical vapor deposition (CVD) or atomic layer deposition (ALD). The thickness of the metallic barrier liner material may be in a range from 1 nm to 5 nm, such as from 2 nm to 3 nm, although lesser and greater thicknesses may also be employed. In one embodiment, the metallic barrier liner material may consist essentially of a conductive metal nitride such as TiN. The metallic fill material may be deposited by a conformal deposition method, which may be, for example, chemical vapor deposition (CVD), atomic layer deposition (ALD), electroless plating, electroplating, or a combination thereof. In one embodiment, the metallic fill material may consist essentially of at least one elemental metal. The at least one elemental metal of the metallic fill material may be selected, for example, from tungsten, cobalt, ruthenium, titanium, and tantalum. In one embodiment, the metallic fill material may consist essentially of a single elemental metal.

A plurality of metallic material layers (64, 66) can be formed in the plurality of lateral recesses, and a continuous metallic material layer 66L may be formed on the sidewalls of each backside trench 79 and over the contact level dielectric layer 73. Each metallic material layer (64, 66) includes a portion of the metallic barrier layer (which includes the metallic barrier liner material) and a portion of a metallic fill material layer (which includes the metallic fill material). The continuous metallic material layer 66L includes a continuous portion of the metallic barrier layer and a continuous portion of the metallic fill material layer that are located in the backside trenches 79 or above the contact level dielectric layer 73.

Each metallic material layer 64 that contacts a source layer 44 constitutes a source contact layer 64, and each metallic material layer 66 that contacts a drain layer 46 constitutes a drain contact layer 66. Each of the source contact layers 64 and the drain contact layers 66 can have a uniform width (which is the lateral recess distance at the processing steps of FIG. 11), and can laterally extend along the first horizontal direction hd1. Formation of the metallic material layers (64, 66) is optional. In case the doped semiconductor material of the source layers 44 and the drain layers 46 is not isotropically etched back at the step shown in FIG. 11, then the metallic material layers (64, 66) are omitted. In this case, the source layer 44 fills the entirety of a backside recess 43 at a source level and the drain layer 46 fills the entirety of a backside recess 43 at a drain level.

Figure 13A:
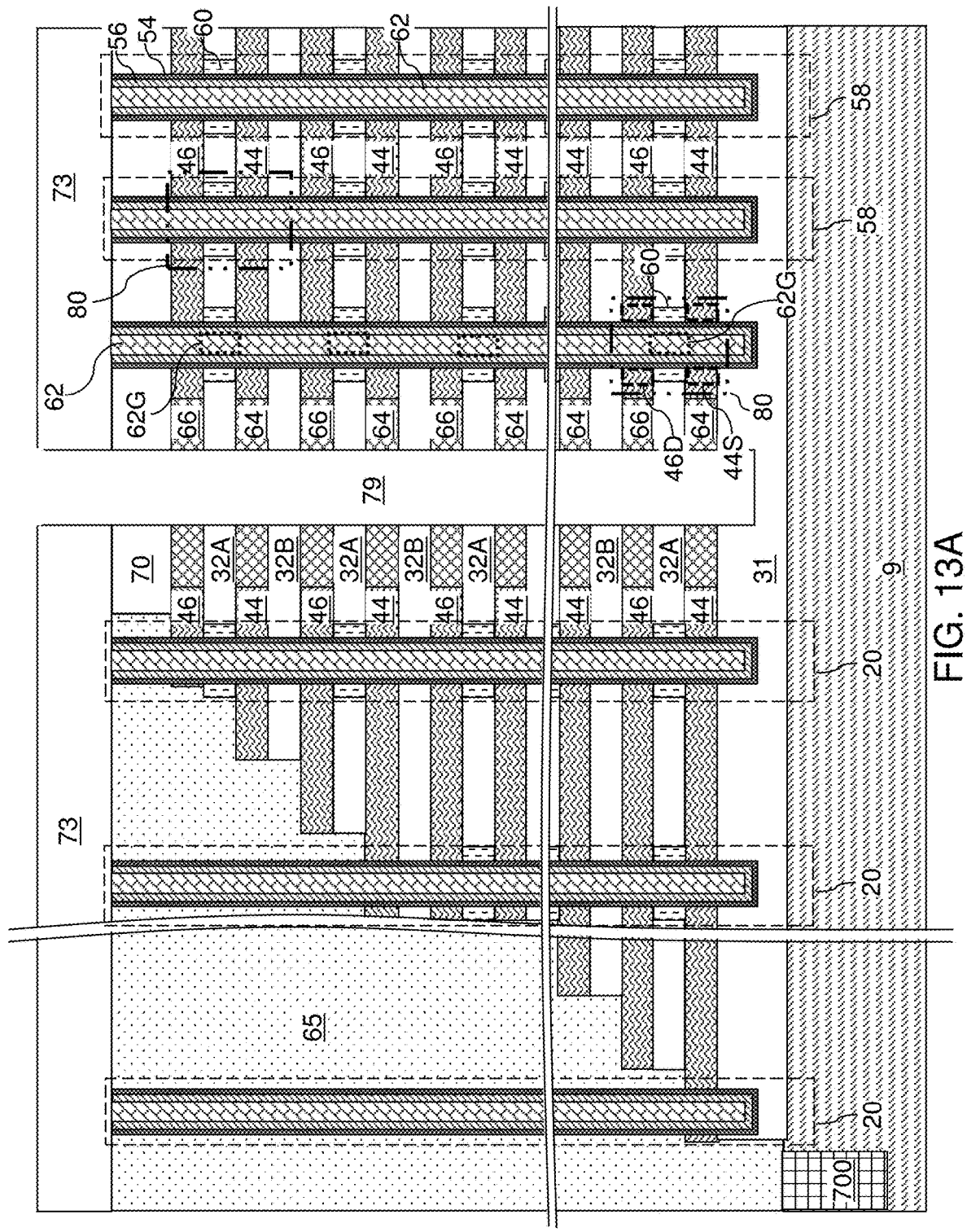
FIG. 13A is a schematic vertical cross-sectional view of the first exemplary structure after removal of the metallic material from the backside trenches and from above the contact-level dielectric layer according to the first embodiment of the present disclosure.
Figure 13B:
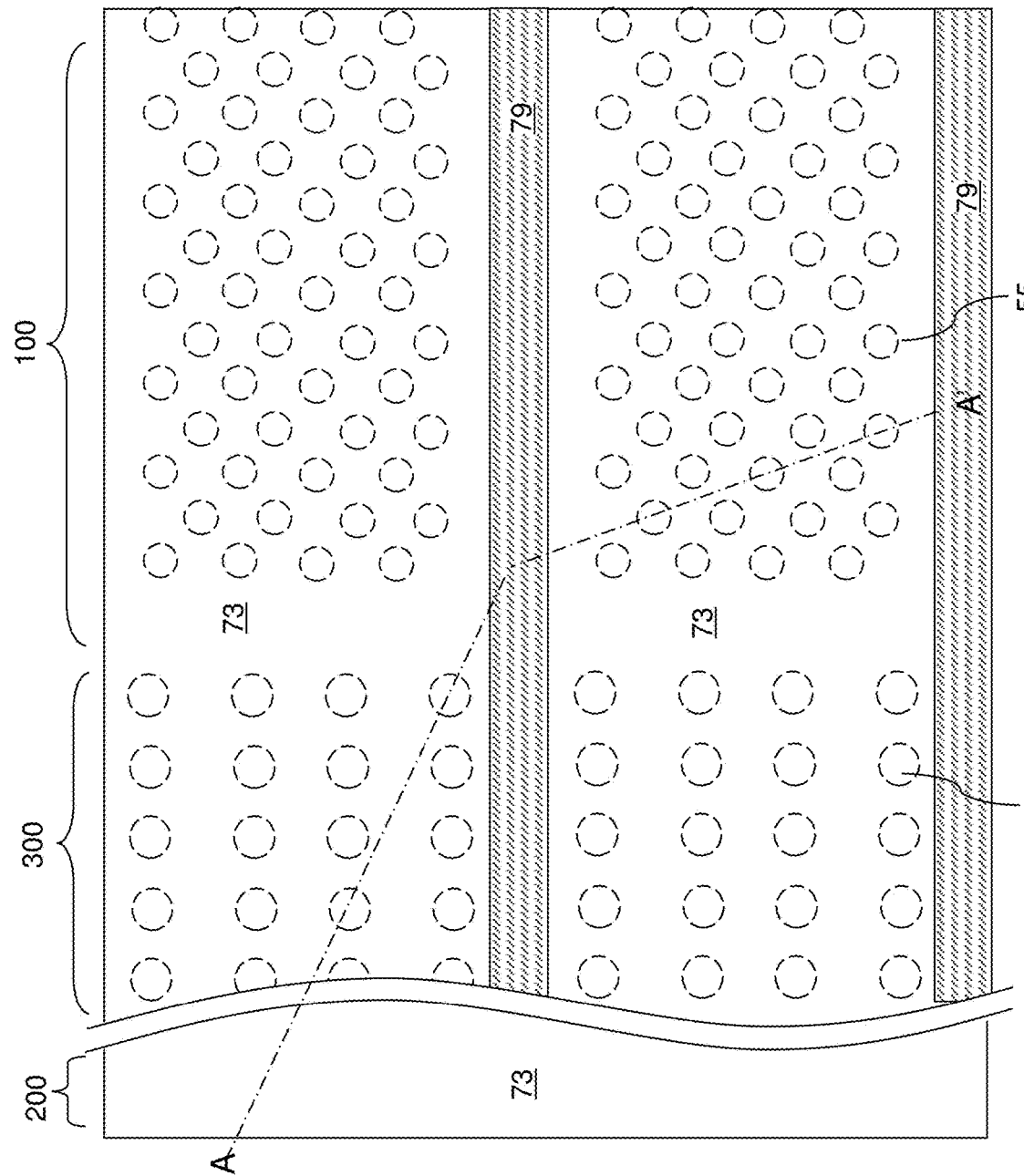
FIG. 13B is a partial see-through top-down view of the first exemplary structure of FIG. 13A. The vertical plane A-A' is the plane of the schematic vertical cross-sectional view of FIG. 13A.

Referring to FIGS. 13A and 13B, the deposited metallic material of the continuous metallic material layer 66L is etched back from the sidewalls of each backside trench 79 and from above the contact level dielectric layer 73, for example, by an isotropic wet etch, an anisotropic dry etch, or a combination thereof. Each remaining portion of the at least one deposited metallic material in the backside recesses 43 constitutes a source contact layer 64 or a drain contact layer 66. Thus, each sacrificial material layers 42 is replaced with a respective replacement material layer {(44, 46), (64, 66)}. Each replacement material layer includes a combination of a source layer 44 and a source contact layer 64 or a combination of a drain layer 46 and a drain contact layer 66. The source contact layers 64 and the drain contact layers 66 can include a respective metallic material layer.

Generally, a source region 44S comprising a portion of a source layer 44 is formed on one end of each semiconductor channel 60, and a drain region 46D comprising a portion of a drain layer 46) is formed on another end of each semiconductor channel 60. At least one contiguous combination, which may be a plurality of contiguous combinations, of a semiconductor channel 60, a source region 44S, and a drain region 46D can be formed on each gate dielectric layer 54. The total number of contiguous combinations of a semiconductor channel 60, a source region 44S, and a drain region 46D contacting each gate dielectric layer 54 in each memory opening 49 can be the same as the total number of channel-level insulating layers 32A within the alternating stack of insulating layers (32A, 32B) and electrically conductive layers {(44, 64), (46, 66)}.

Each of the replacement material layers {(44, 46), (64, 66)} includes a respective source layer 44 containing source regions 44S or a respective drain layer 46 containing drain regions 46D. The source layers 44 and the drain layers 46 are formed on each of the gate dielectric layers 54 located in the memory openings 49. The metallic material layers (64, 66) are formed on a sidewall of a respective one of the source layers 44 and the drain layers 46, and are laterally spaced from the gate dielectric layers 54. Each of the metallic material layers (64, 66) contacts a sidewall of a respective one of the source layers 44 and the drain layers 46, and does not contact the gate dielectric layers 54. In one embodiment, each metallic material layer (64, 66) other than a topmost one of the metallic material layers (64, 66) and other than a bottommost one of the metallic material layers (64, 66) contacts a respective one of the channel-level insulating layers 32A and a respective one of the inter-transistor-level insulating layers 32B.

Each combination of a source layer 44 and a source contact layer 64 constitutes a source-side electrically conductive layer (44, 64). Each combination of a drain layer 46 and drain contact layer 66 constitutes a drain-side electrically conductive layer (46, 66). The source-side electrically conductive layers (44, 64) and the drain-side electrically conductive layers (46, 66) are collectively referred to as electrically conductive layers {(44, 46), (64, 66)}.

A plurality of contiguous combinations of a respective semiconductor channel 60, a respective source region 44S, and a respective drain region 46D can be arranged along the vertical direction on a sidewall of a respective gate dielectric layer 54 around each memory opening 49. Multiple inter-transistor-level insulating layer 32B can be provided within the alternating stack of the insulating layers (32A, 32B) and the electrically conductive layers {(44, 64), (46, 66)} over the substrate 9 such that vertically neighboring pairs of combinations of a semiconductor channel 60, a source region 44S, and a drain region 46D are vertically spaced apart by a respective inter-transistor-level insulating layer 32B.

Figure 14:
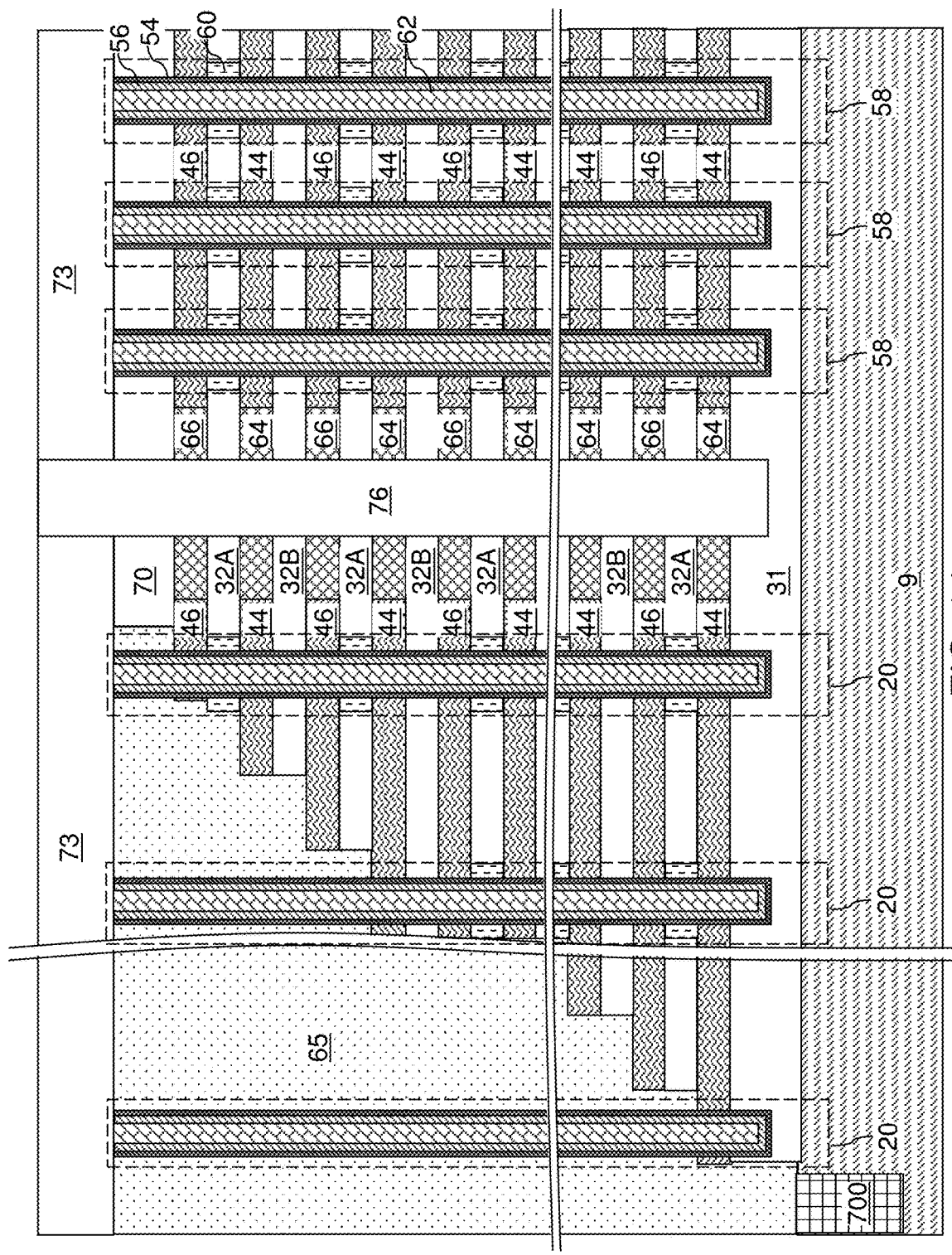
FIG. 14 is a schematic vertical cross-sectional view of the first exemplary structure after formation of dielectric trench fill structures according to the first embodiment of the present disclosure.

Referring to FIG. 14, a dielectric material such as silicon oxide can be deposited in the backside trenches to form dielectric wall structures 76. Each dielectric wall structure 76 can contact sidewalls of each insulating layer (32A, 32B) within an alternating stack of the insulating layers (32A, 32B) and the electrically conductive layers {(44, 64), (46, 66)}, and can contact each metallic material layer (64, 66) within the alternating stack. Each dielectric wall structure 76 is laterally spaced from the source layers 44 and the drain layers 46. The top surface of each dielectric wall structure 76 may be coplanar with the top surface of the contact-level dielectric layer 73. Alternatively, a horizontal portion of the dielectric material that overlie the top surface of the contact-level dielectric layer 73 as provided at the processing steps of FIGS. 13A and 13B may be incorporated into the contact-level dielectric layer 73.

Each ferroelectric material portion of the gate dielectric layers 54 contacting a respective one of the semiconductor channels constitutes a memory element that can store the direction of polarization as a data bit. The polarization of each ferroelectric material portion determines the threshold voltage of a vertical field effect transistor 80 including the respective ferroelectric material portion and an adjoined semiconductor channel 60. If the polarization direction in a ferroelectric material portion is such that the ferroelectric material portion attracts minority charge carriers in the adjoined semiconductor channel 60, the field effect transistor 80 has a low threshold voltage. If the polarization direction in a ferroelectric material portion is such that the ferroelectric material portion repels minority charge carriers in the adjoined semiconductor channel 60, the field effect transistor 80 has a high threshold voltage.

Figure 15A:
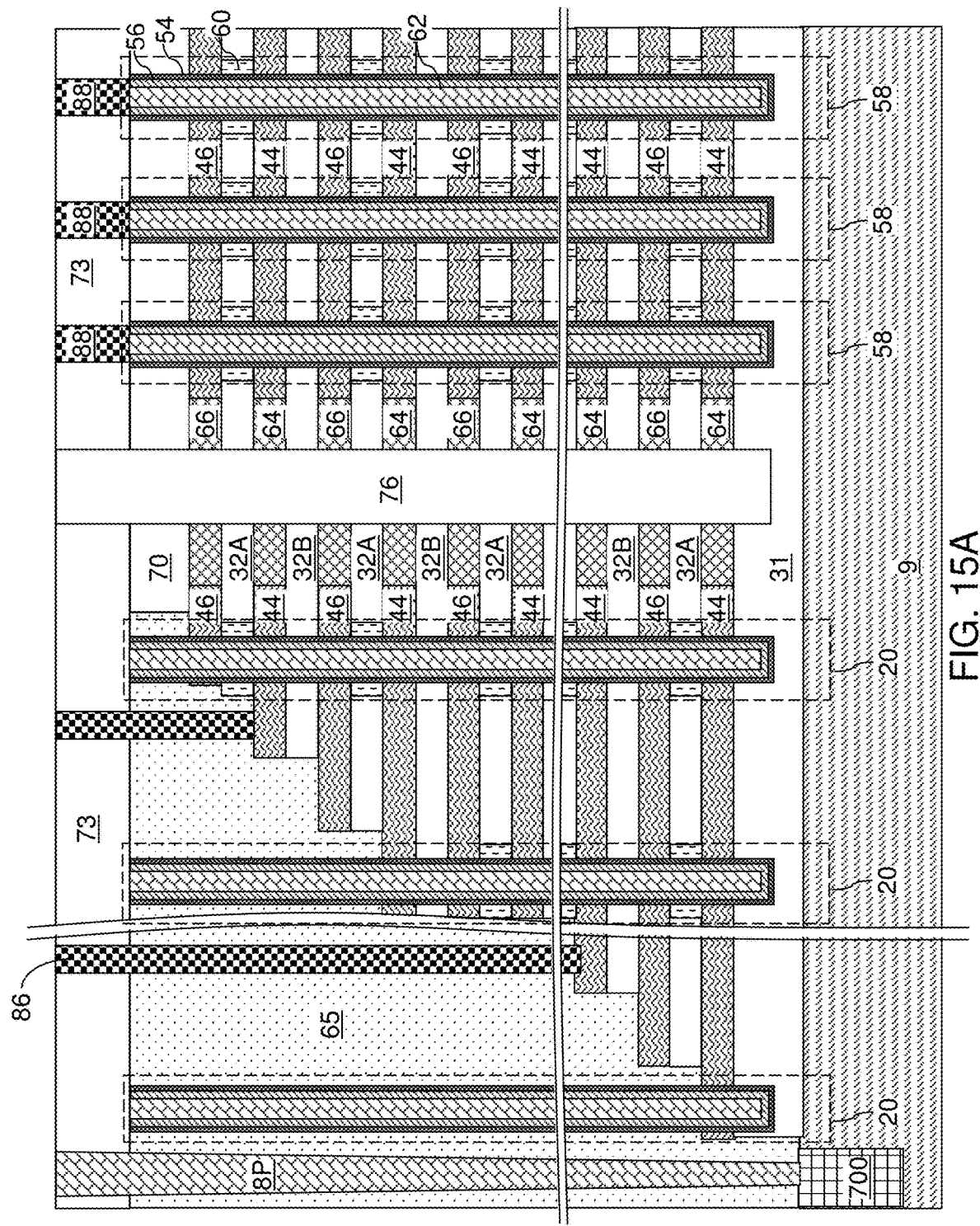
FIG. 15A is a schematic vertical cross-sectional view of the first exemplary structure after formation of contact via structures according to the first embodiment of the present disclosure.
Figure 15B:
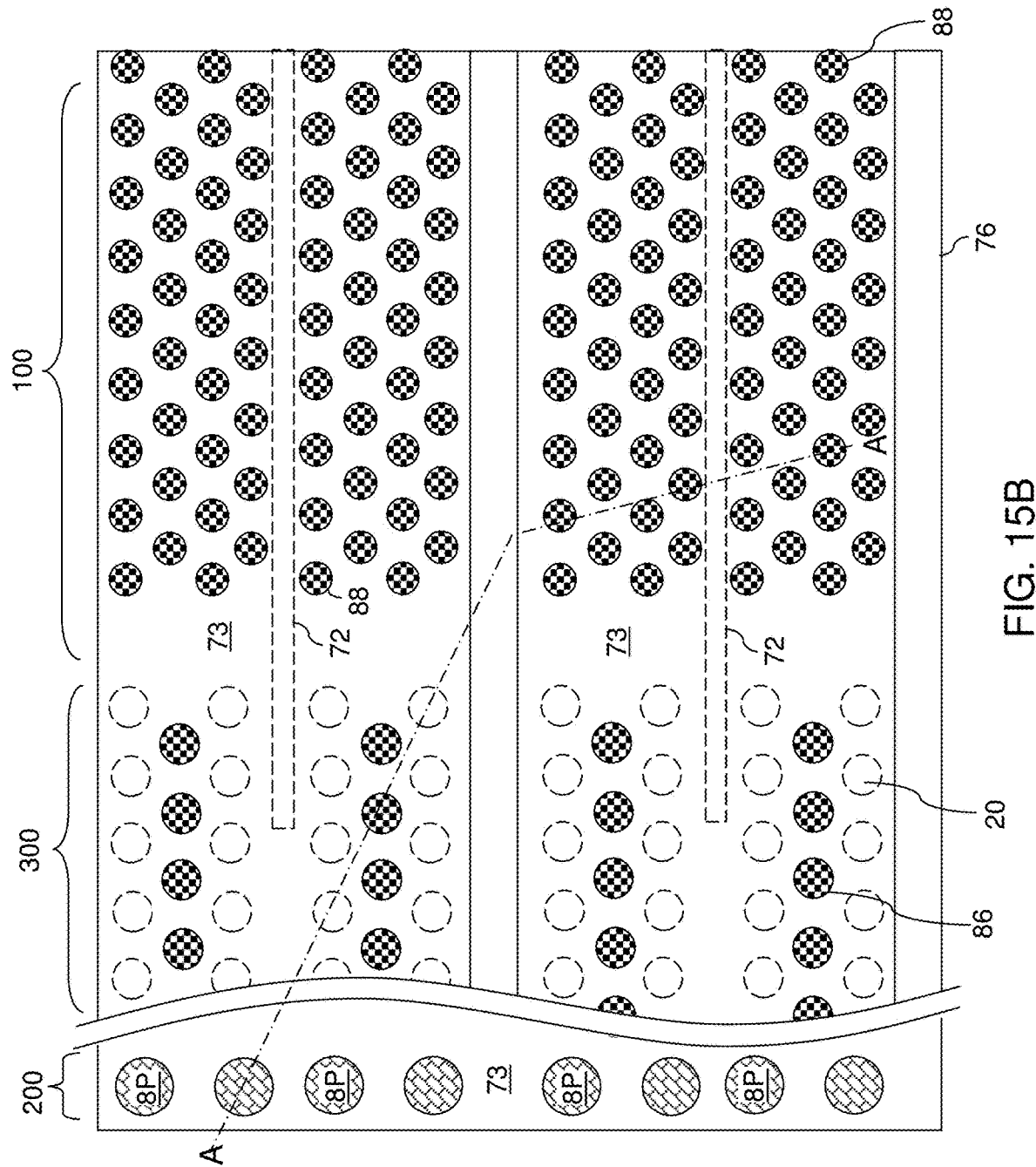
FIG. 15B is a top-down view of the first exemplary structure of FIG. 15A. The vertical plane A-A' is the plane of the schematic vertical cross-sectional view of FIG. 15A.

Referring to FIGS. 15A and 15B, contact via structures (88, 86, 8P) may be formed through the contact level dielectric layer 73, and optionally through the retro-stepped dielectric material portion 65. For example, gate contact via structures 88 may be formed through the contact level dielectric layer 73 on a top surface of a respective word line 62 in the memory array region 100. Source/drain contact via structures 86 may be formed on a respective one of the source layers 44 and the drain layers 46 through the contact level dielectric layer 73, and through the retro-stepped dielectric material portion 65 in the staircase region 300. Peripheral device contact via structures 8P may be formed through the retro-stepped dielectric material portion 65 directly on respective nodes of the peripheral devices 700 in the peripheral region 200. In one alternative embodiment, the peripheral devices 700 are formed on a separate substrate and then bonded to the memory devices. In that case, the peripheral device contact via structures 8P may be omitted. In another alternative embodiment, the peripheral devices 700 may be formed between the bottom insulating layer 31 and the substrate 9, and the peripheral device contact via structures 8P can connect various nodes of the peripheral devices 700 to the various nodes of a three-dimensional array of ferroelectric memory elements.

Figure 16:
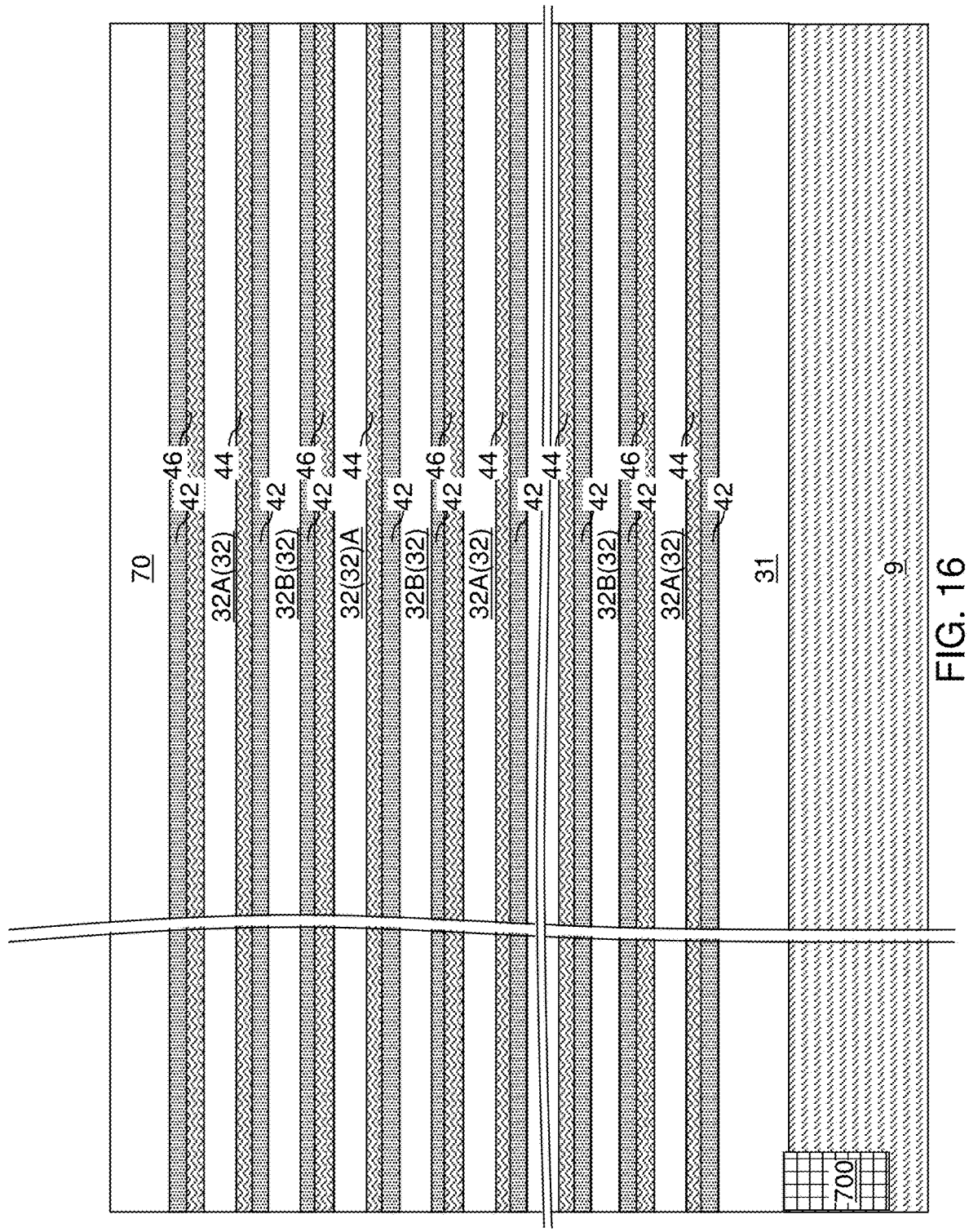
FIG. 16 is a schematic vertical cross-sectional view of a second exemplary structure after formation of insulating layers, doped semiconductor layers, and sacrificial material layers according to a second embodiment of the present disclosure.

Referring to FIG. 16, a second exemplary structure according to a second embodiment of the present disclosure is illustrated, which can be derived from the first exemplary structure of FIG. 1 by forming a bottom insulating layer 31 and a periodic sequence of material layers including multiple repetitions of a unit layer stack. The unit layer stack can include a first instance of a sacrificial material layer 42, a first instance of a doped semiconductor layer that can be a source layer 44, a channel-level insulating layer 32A, a second instance of the doped semiconductor layer that can be a drain layer 46, a second instance of a sacrificial material layer 42 and an inter-transistor-level insulating layer 32B. An inter-transistor-level insulating layer 32B of the topmost repetition of the unit layer stack can be replaced with an insulating cap layer 70.

Semiconductor channels to be subsequently formed have a doping of a first conductivity type. The doped semiconductor layers (44, 46) have a doping of the second conductivity type, which is the opposite of the first conductivity type. The atomic concentration of the dopants of the second conductivity type in the doped semiconductor layers (44, 46) can be in a range from $5.0 \times 10^{19}/cm^3$ to $2.0 \times 10^{21}/cm^3$, although lesser and greater dopant concentrations can also be employed. The thickness of each doped semiconductor layer (44, 46) can be in a range from 10 nm to 50 nm, although lesser and greater thicknesses can also be employed.

Each doped semiconductor layer (44, 46) is formed between, and contacts, a vertically neighboring pair of one of the channel-level insulating layers 32A and one of the sacrificial material layers 42. Each of the doped semiconductor layers (44, 46) can comprise a source layer 44 or a drain layer 44. Each source layer 44 includes a two-dimensional array of source regions for a two-dimensional array of semiconductor channels to be subsequently formed, and each drain layer 46 includes a two-dimensional array of drain regions for a two-dimensional array of semiconductor channels to be subsequently formed.

Figure 17:
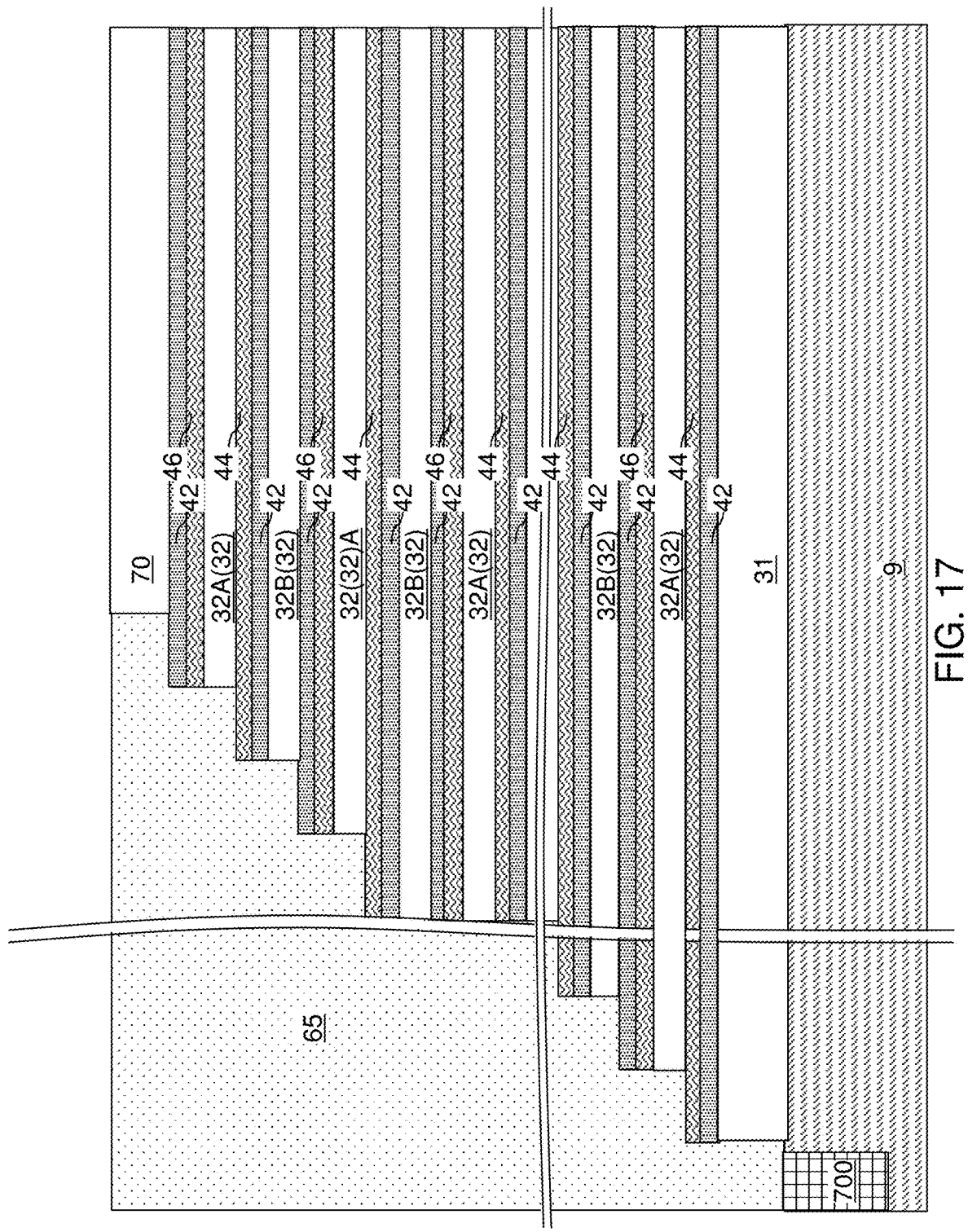
FIG. 17 is a schematic vertical cross-sectional view of the second exemplary structure after formation of stepped terraces and a retro-stepped dielectric material portion according to the second embodiment of the present disclosure.

Referring to FIG. 17, the processing steps of FIG. 3 can be performed with a modification such that the anisotropic etch processes that forms the vertical steps extending through a combination of a sacrificial material layer 42 and an insulating layer 32 are modified to provide vertical steps extending through a contiguous combination of a sacrificial material layer 42, a drain layer 46, and a transistor-level insulating layer 32A, or through a contiguous combination of a source layer 44, a sacrificial material layer 42, and an inter-transistor-level insulating layer 32B. In this case, the terminal step of each anisotropic etch process that forms the first vertical steps of the various layers in the layer stack including multiple repetitions of the unit layer stack (42, 44, 32A, 46, 42, 32B) can be selective to the material of the sacrificial material layers 42 or selective to the material of the source layers 44. A retro-stepped dielectric material portion 65 can be formed in the stepped cavity to form a retro-stepped dielectric material portion 65.

Figure 18:
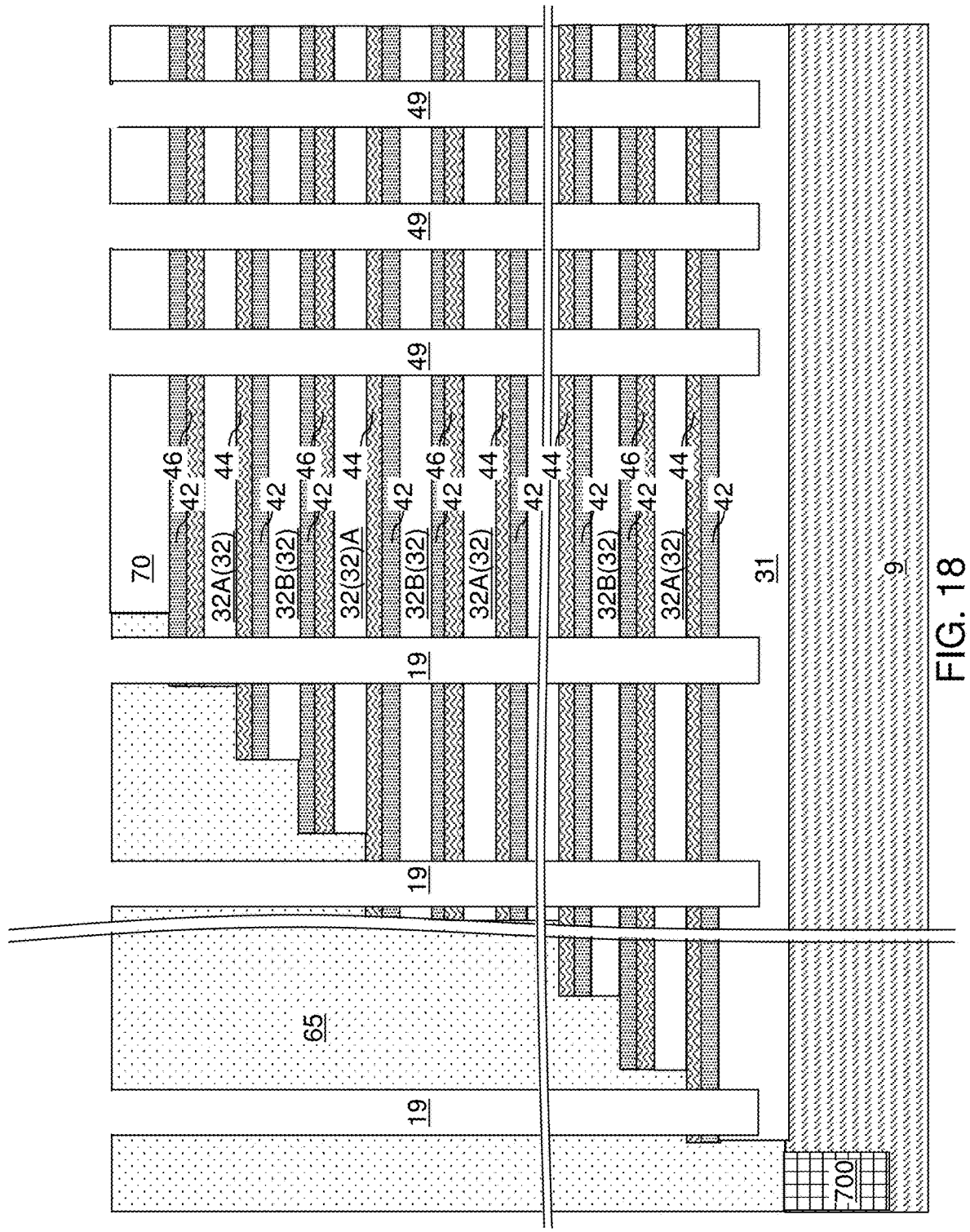
FIG. 18 is a schematic vertical cross-sectional view of the second exemplary structure after formation of memory openings and support openings according to the second embodiment of the present disclosure.

Referring to FIG. 18, the processing steps of FIGS. 4A and 4B can be performed with a modification to the etch chemistry of the anisotropic etch process to etch through unmasked portions of the insulating cap layer 70 and the layer stack including multiple repetitions of the unit layer stack (42, 44, 32A, 46, 42, 32B). The bottom insulating layer 31 can be employed as an etch stop structure. Memory openings 49 are formed in the memory array region 100, and support openings 19 are formed in the staircase region 300.

Figure 19:
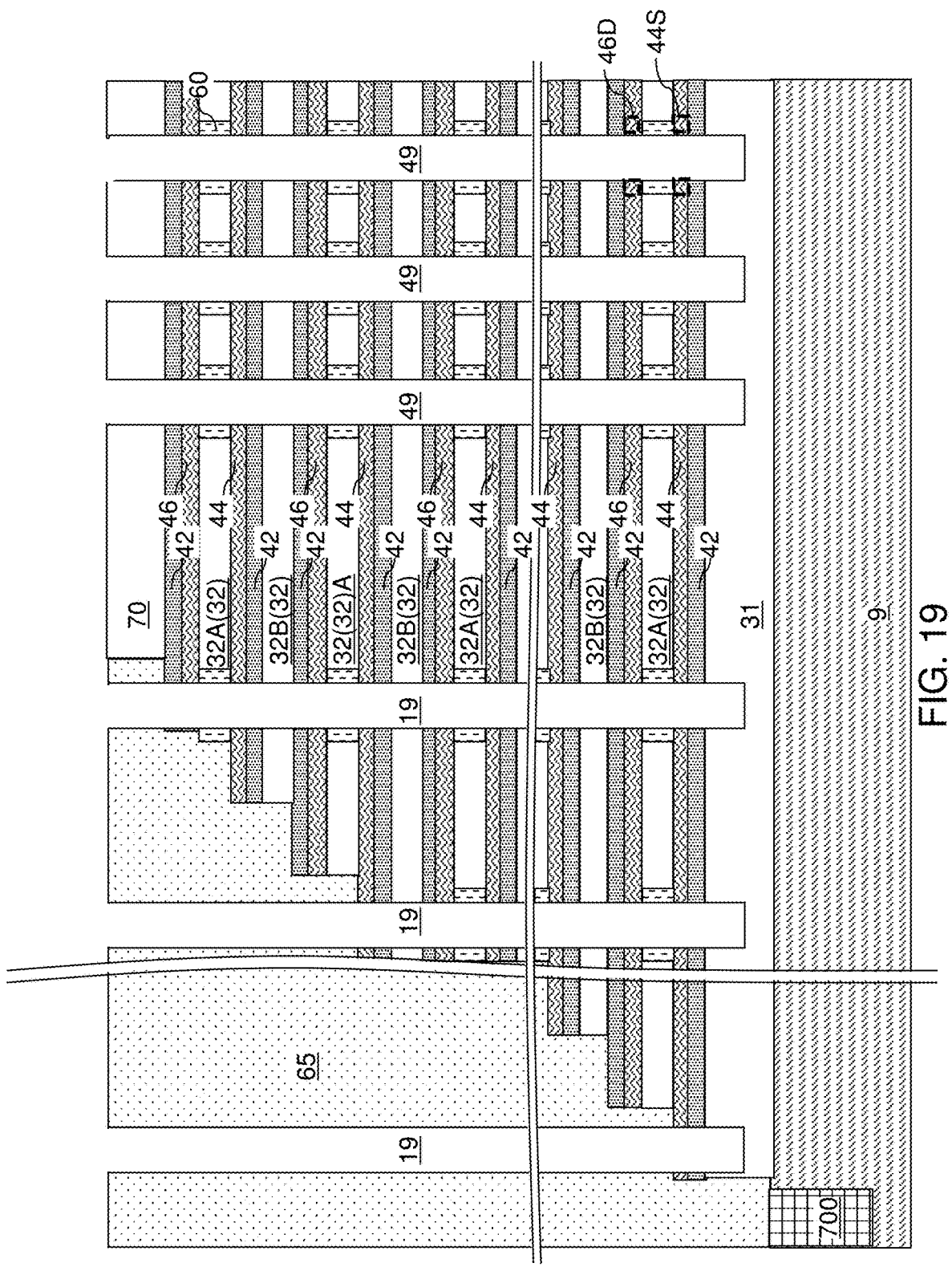
FIG. 19 is a schematic vertical cross-sectional view of the second exemplary structure after formation of semiconductor channels having a tubular configuration according to the second embodiment of the present disclosure.

Referring to FIG. 19, an isotropic etch process can be performed to laterally recess physically exposed cylindrical sidewalls of the channel-level insulating layers 32A selective to the materials of the sacrificial material layers 42, the doped semiconductor layers (44, 46), and the inter-transistor-level insulating layers 32B, as described above with respect to FIG. 4. The semiconductor channels 60 are then formed in the recesses as described above with respect to FIG. 5.

One end of each semiconductor channel 60 contacts a horizontal surface of a source layer 44, and another end of each semiconductor channel 60 contacts a horizontal surface of a drain layer 46. Each portion of the source layers 44 that contacts, and/or is proximal to, a semiconductor channel 60 constitutes a source region 44S, and each portion of the drain layers 46 that contacts, and/or is proximal to, a semiconductor channel 60 constitutes a drain region 46D. Inner cylindrical sidewalls of the semiconductor channels 60 can be vertically coincident with overlying or underlying sidewalls of the insulating layers 32 and the doped semiconductor layers (44, 46).

Figure 20:
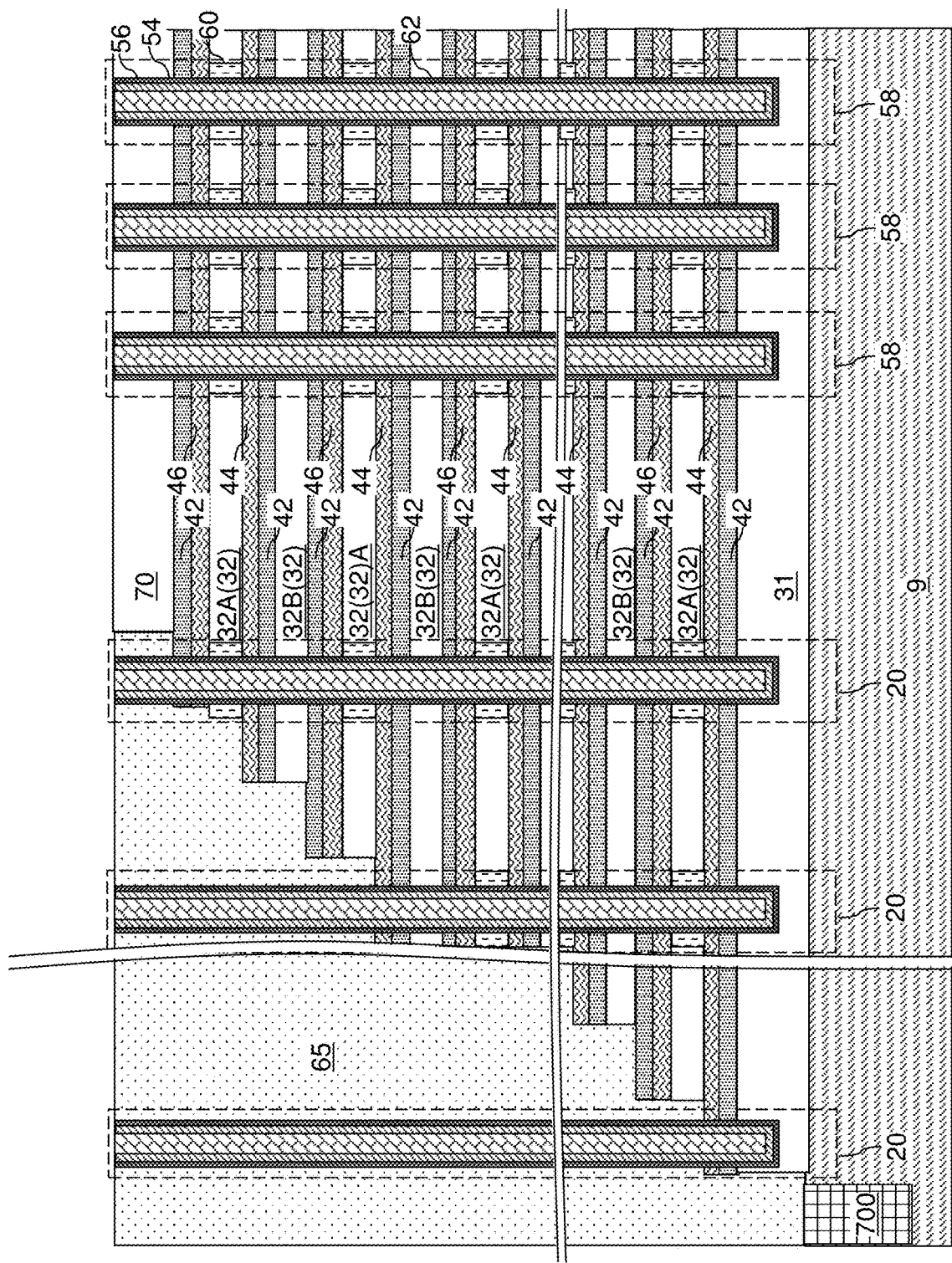
FIG. 20 is a schematic vertical cross-sectional view of the second exemplary structure after formation of a layer stack including, from one side to another, a gate dielectric layer, a selector material layer, and a word line in each memory opening according to the second embodiment of the present disclosure.

Referring to FIG. 20, the processing steps of FIGS. 7A and 7B can be performed to form a layer stack including a gate dielectric layer 54, a selector material layer 56, and a word line 62 in each of the memory openings 49 and the support openings 19. The semiconductor channels 60 are not present on portions of the support pillar structures 20 that extend through the retro-stepped dielectric material portion 65.

Figure 21:
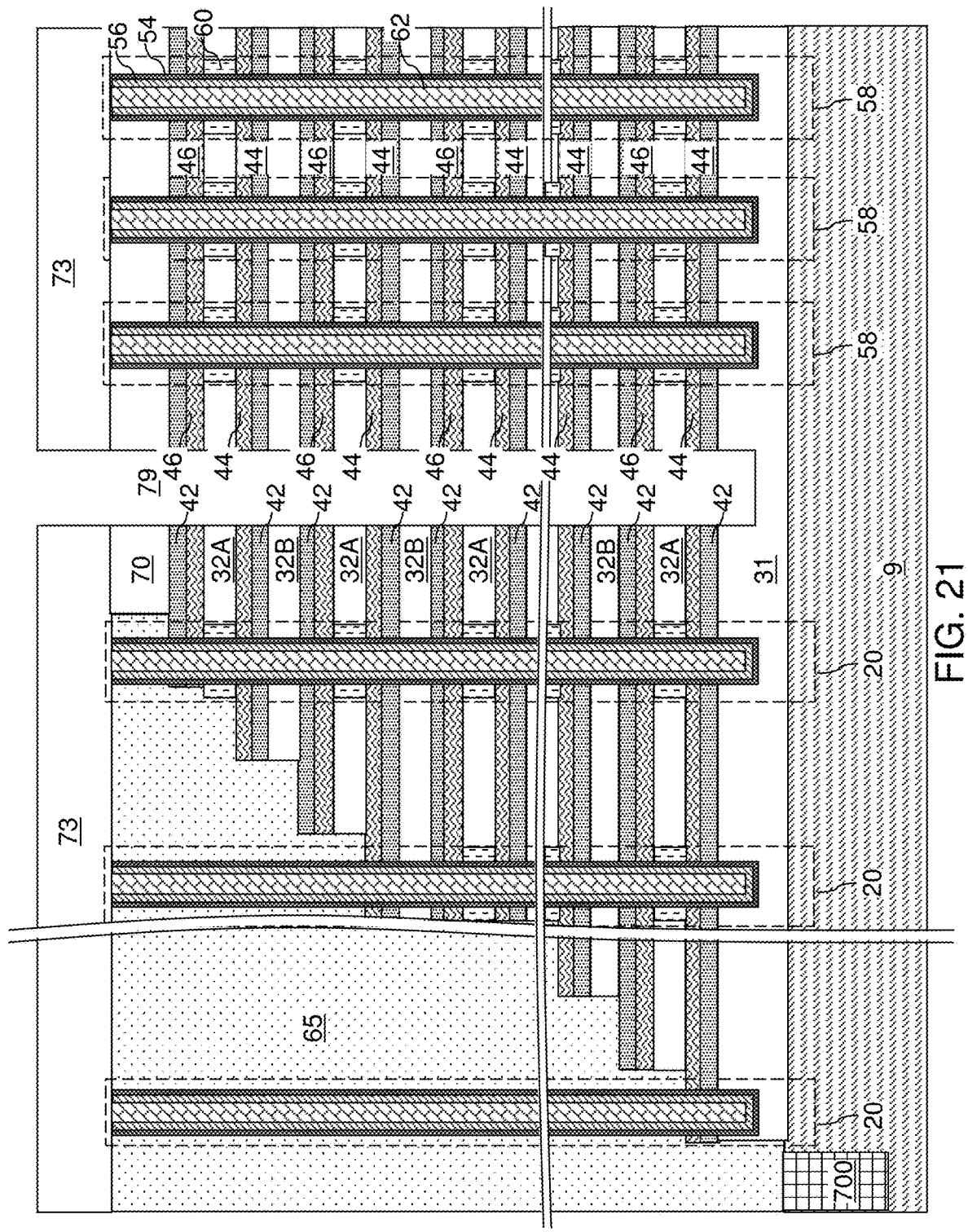
FIG. 21 is a schematic vertical cross-sectional view of the second exemplary structure after formation of a contact-level dielectric layer and backside trenches according to the second embodiment of the present disclosure.

Referring to FIG. 21, a contact level dielectric layer 73 may be formed over the insulating cap layer 70, the memory opening fill structures 58, and the support pillar structures 20. A photoresist layer (not shown) may be applied over the contact level dielectric layer 73, and is lithographically patterned to form openings in areas between clusters of memory opening fill structures 58. The pattern in the photoresist layer may be transferred through the contact level dielectric layer 73, the multiple repetitions of the unit layer stack (42, 44, 32A, 46, 42, 32B) and/or the retro-stepped dielectric material portion 65 employing an anisotropic etch to form backside trenches 79, which vertically extend from the top surface of the contact level dielectric layer 73 down to the bottom insulating layer 31, and laterally extend through the memory array region 100 and the staircase region 300.

In one embodiment, the backside trenches 79 may laterally extend along a first horizontal direction hd1 and may be laterally spaced apart from each other along a second horizontal direction hd2 that is perpendicular to the first horizontal direction hd1. The memory opening fill structures 58 may be arranged in rows that extend along the first horizontal direction hd1. Each backside trench 79 may have a uniform width that is invariant along the lengthwise direction (i.e., along the first horizontal direction hd1). The photoresist layer may be removed, for example, by ashing.

Figure 22:
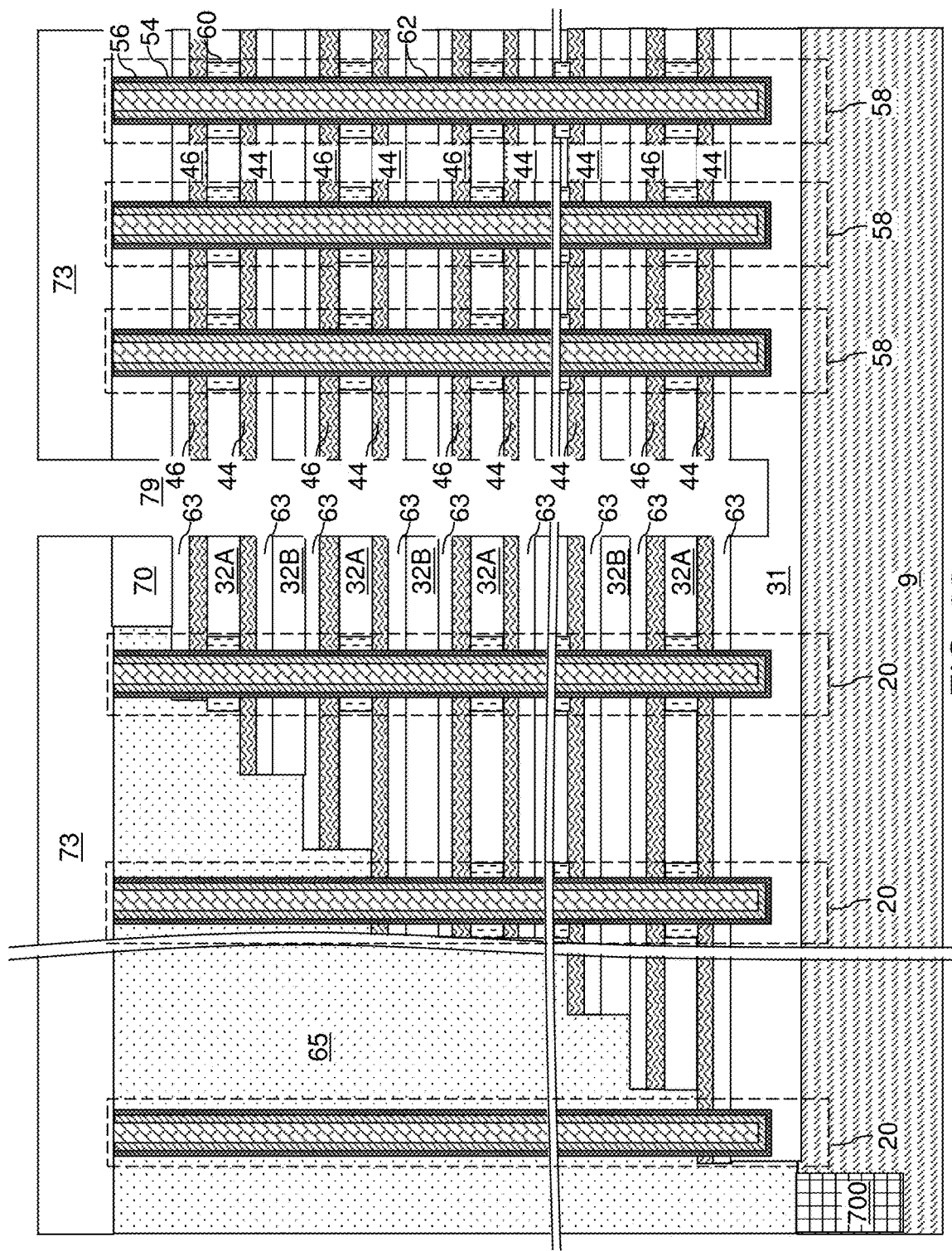
FIG. 22 is a schematic vertical cross-sectional view of the second exemplary structure after formation of backside recesses according to the second embodiment of the present disclosure.

Referring to FIG. 22, an etchant that selectively etches the sacrificial material layers 42 with respect to the insulating layers (32A, 32B) and the doped semiconductor layers (44, 46) may be introduced into the backside trenches 79, for example, employing an etch process. Backside recesses 63 are formed in volumes from which the sacrificial material layers 42 are removed. The removal of the sacrificial material layers 42 may be selective to the material of the insulating layers (32A, 32B), the material of the doped semiconductor layers (44, 46), the material of the retro-stepped dielectric material portion 65, and the material of the gate dielectric layers 54. In one embodiment, the sacrificial material layers 42 may include silicon nitride, and the materials of the insulating layers (32A, 32B) and the retro-stepped dielectric material portion 65 may be selected from silicon oxide and dielectric metal oxides.

The etch process that removes the sacrificial material layers 42 selective to the insulating layers (32A, 32B), the doped semiconductor layers (44, 46), and the gate dielectric layers 54 may be a wet etch process employing a wet etch solution, or may be a gas phase (dry) etch process in which the etchant is introduced in a vapor phase into the backside trenches 79. For example, if the sacrificial material layers 42 include silicon nitride, the etch process may be a wet etch process in which the first exemplary structure is immersed within a wet etch tank including phosphoric acid, which etches silicon nitride selective to silicon oxide, silicon, and various other materials employed in the art. The support pillar structure 20, the retro-stepped dielectric material portion 65, and the memory opening fill structures 58 provide structural support while the backside recesses 63 are present within volumes previously occupied by the sacrificial material layers 42.

Each backside recess 63 may be a laterally extending cavity having a lateral dimension that is greater than the vertical extent of the cavity. A plurality of backside recesses 63 may be formed in the volumes from which the sacrificial material layers 42 are removed. The memory openings 49 in which the memory opening fill structures 58 are formed are herein referred to as front side openings or front side cavities in contrast with the backside recesses 63.

Each of the plurality of backside recesses 63 may extend substantially parallel to the top surface of the substrate 9. A backside recess 63 may be vertically bounded by a top surface of an underlying insulating layer (such as an inter-transistor-level insulating layer 32B) and a bottom surface of an overlying doped semiconductor layer (such as a source layer 44), or may be vertically bounded by a top surface of an underlying doped semiconductor layer (such as a drain layer 46) and a bottom surface of an overlying insulating layer (such as an inter-transistor-level insulating layer 32B). In one embodiment, each backside recess 63 may have a uniform height throughout.

Figure 23:
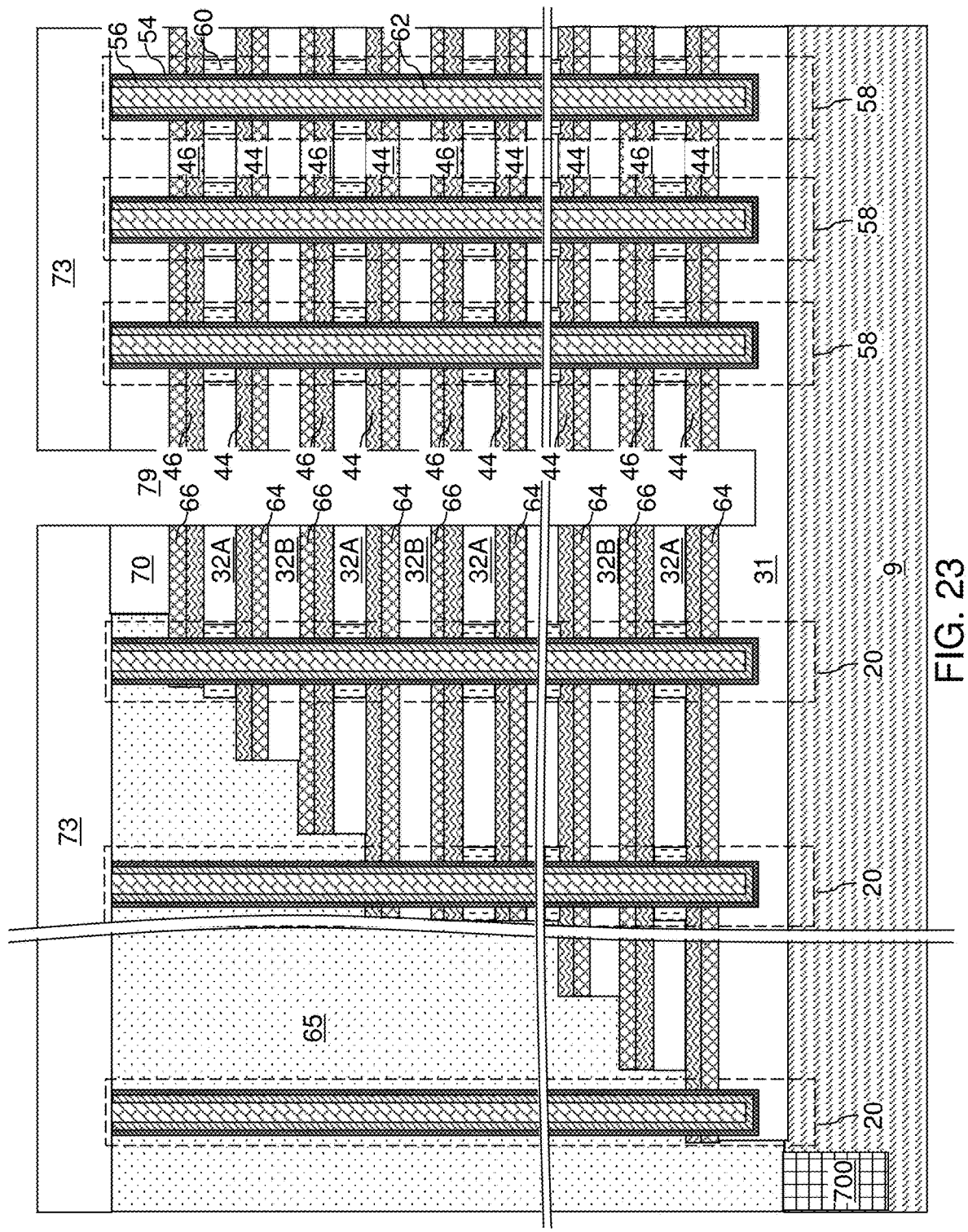
FIG. 23 is a schematic vertical cross-sectional view of the second exemplary structure after formation of metallic material layers according to the second embodiment of the present disclosure.

Referring to FIG. 23, at least one metallic material can be deposited in the backside recesses 63, at peripheral regions of the backside trenches 79, and over the contact-level dielectric layer 73. The at least one metallic material can include a metallic barrier liner material and a metallic fill material. The metallic barrier liner material can include a conductive metallic nitride material such as TiN, TaN, WN, or a stack thereof. In one embodiment, the metallic barrier liner material may be deposited by a conformal deposition process such as chemical vapor deposition (CVD) or atomic layer deposition (ALD). The thickness of the metallic barrier liner material may be in a range from 1 nm to 5 nm, such as from 2 nm to 3 nm, although lesser and greater thicknesses may also be employed. In one embodiment, the metallic barrier liner material may consist essentially of a conductive metal nitride such as TiN. The metallic fill material may be deposited by a conformal deposition method, which may be, for example, chemical vapor deposition (CVD), atomic layer deposition (ALD), electroless plating, electroplating, or a combination thereof. In one embodiment, the metallic fill material may consist essentially of at least one elemental metal. The at least one elemental metal of the metallic fill material may be selected, for example, from tungsten, cobalt, ruthenium, titanium, and tantalum. In one embodiment, the metallic fill material may consist essentially of a single elemental metal.

A plurality of metallic material layers (64, 66) can be formed in the plurality of backside recesses 63, and a continuous metallic material layer may be formed on the sidewalls of each backside trench 79 and over the contact level dielectric layer 73. Each metallic material layer (64, 66) includes a portion of the metallic barrier layer (which includes the metallic barrier liner material) and a portion of a metallic fill material layer (which includes the metallic fill material). The continuous metallic material layer includes a continuous portion of the metallic barrier layer and a continuous portion of the metallic fill material layer that are located in the backside trenches 79 or above the contact level dielectric layer 73.

Each metallic material layer 64 that contacts a source layer 44 constitutes a source contact layer 64, and each metallic material layer 66 that contacts a drain layer 46 constitutes a drain contact layer 66. The area of each source contact layer 64 can be the same as the area of an overlying source layer 44, and the area of each drain contact layer 66 can be the same as the area of an underlying drain layer 46.

The deposited metallic material of the continuous metallic material layers are etched back from the sidewalls of each backside trench 79 and from above the contact level dielectric layer 73, for example, by an isotropic wet etch, an anisotropic dry etch, or a combination thereof. Each remaining portion of the at least one deposited metallic material in the backside recesses 63 constitutes a source contact layer 64 or a drain contact layer 66. Thus, each sacrificial material layers 42 is replaced with a respective replacement material layer that includes, and/or consists of, one of the source contact layers 64 and the drain contact layers 66. The source contact layers 64 and the drain contact layers 66 can include a respective metallic material layer. Each contiguous combination of a source layer 44 and a source contact layer 64 constitutes a source-side electrically conductive layer (44, 64), and each contiguous combination of a drain layer 46 and a drain contact layer 66 constitutes a drain-side electrically conductive layer (46, 66). The source-side electrically conductive layers (44, 64) and the drain-side electrically conductive layers (46, 66) are collectively referred to as electrically conductive layers {(44, 64), (46, 66)}.

Generally, a source region 44S (comprising a portion of a source layer 44) is formed on one end of each semiconductor channel 60, and a drain region 46D (comprising a portion of a drain layer 46) is formed on another end of each semiconductor channel 60. At least one contiguous combination, which may be a plurality of contiguous combinations, of a semiconductor channel 60, a source region 44S, and a drain region 46D can be formed on each gate dielectric layer 54. An alternating stack of insulating layers (32A, 32B) and electrically conductive layers {(44, 64), (46, 66)} can be formed over the substrate 9. The total number of contiguous combinations of a semiconductor channel 60, a source region 44S, and a drain region 46D contacting each gate dielectric layer 54 can be the same as the total number of channel-level insulating layers 32A within the alternating stack [(32A, 32B), {(44, 64), (46, 66)}].

The source layers 44 and the drain layers 46 are formed on each of the gate dielectric layers 54 located in the memory openings 49, and contacts horizontal surfaces of the semiconductor channels 60. The metallic material layers (64, 66) are formed directly on each of the gate dielectric layers 54, and are vertically spaced from the semiconductor channels 60 by a respective one of the source layers 44 and the drain layer 46. Each of the metallic material layers (64, 66) contacts a sidewall of each of the gate dielectric layers 54 that are laterally enclosed by the metallic material layers (64, 66).

A plurality of contiguous combinations of a respective semiconductor channel 60, a respective source region 44S, and a respective drain region 46D can be arranged along the vertical direction on a sidewall of a respective gate dielectric layer 54 around each memory opening 49. Multiple inter-transistor-level insulating layer 32B can be provided within the alternating stack of the insulating layers (32A, 32B) and the electrically conductive layers {(44, 64), (46, 66)} over the substrate 9 such that vertically neighboring pairs of combinations of a semiconductor channel 60, a source region 44S, and a drain region 46D are vertically spaced apart by a respective inter-transistor-level insulating layer 32B.

Figure 24:
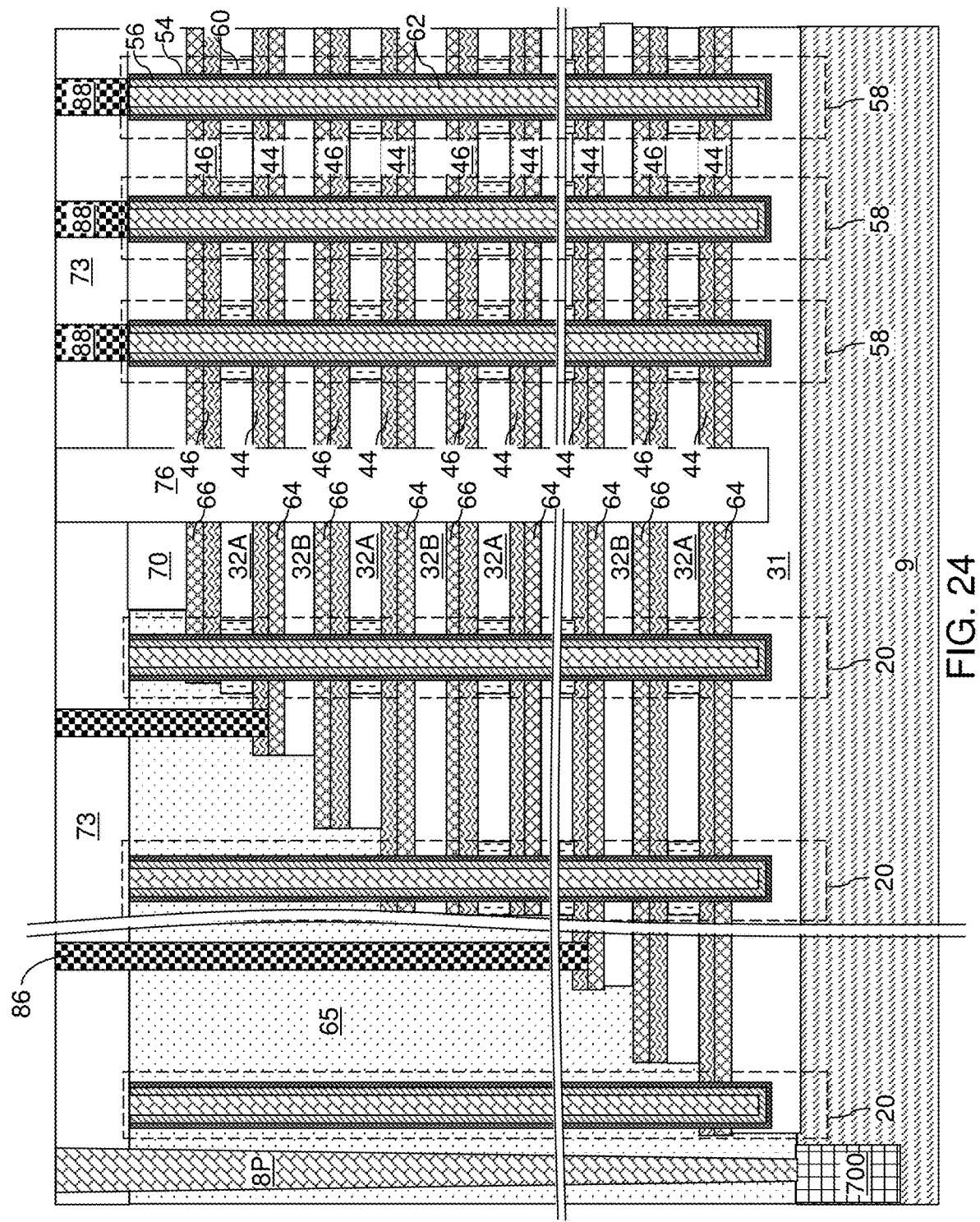
FIG. 24 is a schematic vertical cross-sectional view of the second exemplary structure after formation of dielectric trench fill structures and contact via structures according to the second embodiment of the present disclosure.

Referring to FIG. 24, the processing steps of FIGS. 14, 15A, and 15B can be performed to form dielectric wall structures 76 and various contact via structures (88, 86, 8P). For example, gate contact via structures 88 may be formed through the contact level dielectric layer 73 on a top surface of a respective word line 62 in the memory array region 100. Source/drain contact via structures 86 may be formed on a respective one of the source layers 44 and the drain layers 46 through the contact level dielectric layer 73, and through the retro-stepped dielectric material portion 65 in the staircase region 300. The metallic material layers (64, 66) can be employed as etch stop structures during formation of via cavities for forming the source/drain contact via structure 86. In this case, each of the source/drain contact via structures 86 can contact a respective one of the source contact layers 44 and the drain contact layers 46. Peripheral device contact via structures 8P may be formed through the retro-stepped dielectric material portion 65 directly on respective nodes of the peripheral devices 700 in the peripheral region 200. In one alternative embodiment, the peripheral devices 700 are formed on a separate substrate and then bonded to the memory devices. In that case, the peripheral device contact via structures 8P may be omitted. In another alternative embodiment, the peripheral devices 700 may be formed between the bottom insulating layer 31 and the substrate 9, and the peripheral device contact via structures 8P can connect various nodes of the peripheral devices 700 to the various nodes of a three-dimensional array of ferroelectric memory elements.

Figure 25:
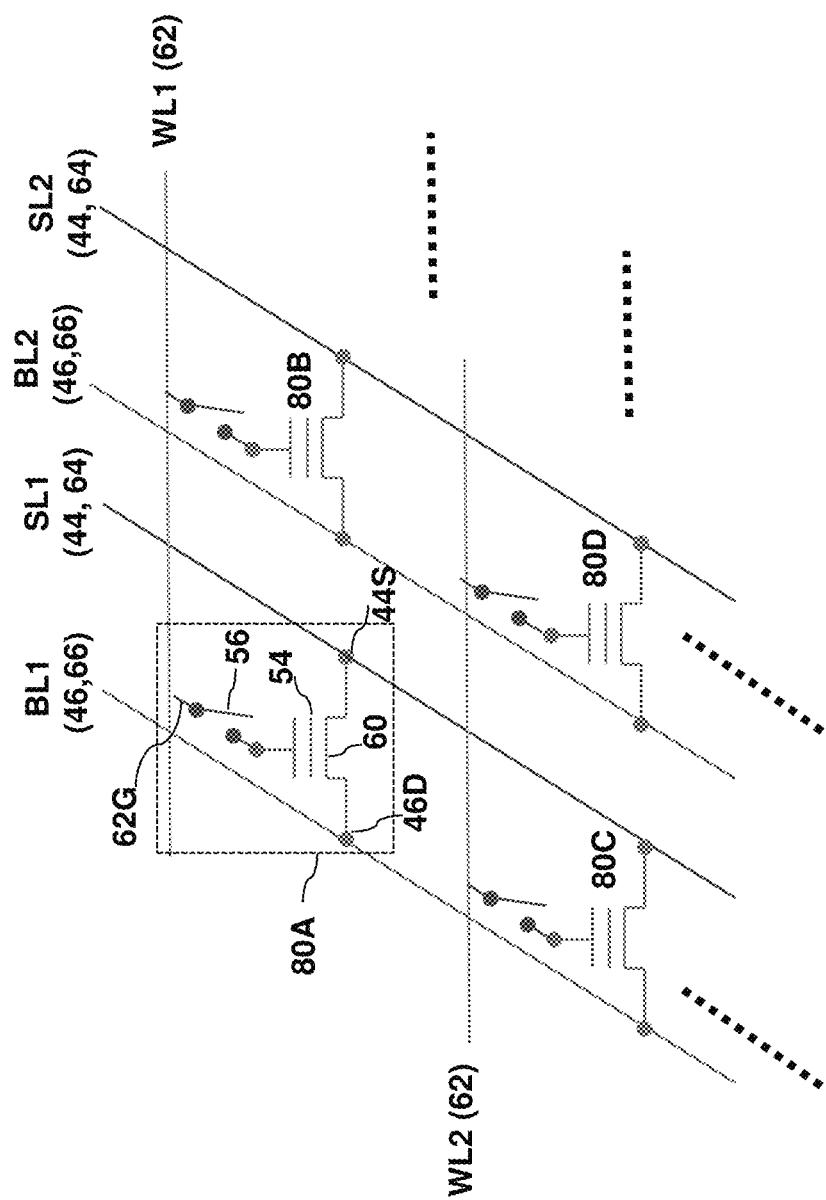
FIG. 25 is a schematic circuit diagram of the three-dimensional array of memory elements according to embodiments of the present disclosure.

Referring to FIG. 25, a schematic circuit diagram of the three-dimensional array of memory elements according to embodiments of the present disclosure is illustrated. Each field effect transistor (i.e., ferroelectric field effect transistor, FeFET) 80A includes a semiconductor channel 60, a source region 44S contacting one end of the semiconductor channel 60, a drain region 46D contacting the opposite end of the semiconductor channel 60, a gate electrode 62G located adjacent to each semiconductor channel 60, a ferroelectric gate dielectric layer 54 located between the semiconductor channel 60 and the gate electrode 62G, and a bipolar selector material layer 56 located between the gate electrode 62G and the ferroelectric gate dielectric layer 54. The gate electrode 62G may be part of a vertical word line 62 (WL1, WL2).

The source region 44S may comprise a part of a source layer 44, and the drain region 46D may comprise a portion of a drain layer 46. Each source layer 44 may comprise at least a portion of a source line (44, 64) (SL1, SL2) and each drain layer 46 may comprise at least a portion of a bit line (46, 66) (BL1, BL2).

Each word line 62 (WL1, WL2) controls the gate electrodes 62G of a respective vertical stack of vertical field effect transistors 80, such as a stack of a first vertical field effect transistor 80A and a second vertical field effect transistor 80B, etc., or a stack of a third vertical field effect transistor 80C and a fourth field effect transistor 80D, etc., as illustrated in FIG. 25.

In a FeFET without the bipolar selector material layer 56, the program or erase disturb voltage could be one half of the program and erase voltage. By adding the bipolar selector material layer 56 between the gate electrode 62G and the semiconductor channel 60 of a FeFET 80 of the embodiments of the present disclosure, there is no program or erase disturb on the FeFET 80. In one embodiment, the bipolar selector material layer 56 may have a switching threshold voltage that is greater than one half of the program and erase voltage that is needed to program and erase the FeFET 80. If the voltage difference between word line and bit line voltages is greater than the switching threshold voltage of the bipolar selector material layer 56, then the semiconductor channel can be activated by the word line voltage. If the voltage difference between word line and bit line voltages is less than the switching threshold voltage of the bipolar selector material layer 56, then the semiconductor channel 60 is inactivated (i.e., the gate electrode to semiconductor channel bias is about 0V).

Referring to all drawings and according to various embodiments of the present disclosure, a ferroelectric field effect transistor (FeFET) 80 (e.g., 80A) includes a semiconductor channel 60, a source region 44S contacting one end of the semiconductor channel, a drain region 46D contacting a second end of the semiconductor channel, a gate electrode 62G, a ferroelectric gate dielectric layer 54 located between the semiconductor channel and the gate electrode, and a bipolar selector material layer 56 located between the gate electrode and the ferroelectric gate dielectric layer.

In one embodiment, the FeFET also includes a substrate 9 having a horizontal surface 7, wherein the semiconductor channel, the ferroelectric gate dielectric layer, the bipolar selector material layer, and the gate electrode extend along a vertical direction perpendicular to the horizontal surface 7. The gate electrode 62G comprises a portion of a vertical word line 62 which extends perpendicular to the horizontal surface.

In one embodiment, the source region 44S comprises a portion of a source layer 44, the drain region 46D comprises portion of a drain layer 46, the source layer 44 comprises at least a portion of a source line (44, 64), and the drain layer 46 comprises at least a portion of a bit line (46, 66). In one embodiment, a channel-level insulating layer 32A is located between the source region 44S and the drain region 46D.

In one embodiment a three dimensional FeFET array includes the FeFET 80A, an additional FeFET 80B located below the FeFET 80A, an inter-transistor-level insulating layer 32B located between the source line (44, 64) of the FeFET 80A and a bit line (46,66) of the additional FeFET 80B.

In one embodiment, the FeFET array comprises an alternating stack of insulating layers (32A, 32B) and electrically conductive layers {(44, 64), (46, 66)} that alternate along the vertical direction; a set of all insulating layers (32A, 32B) within the alternating stack comprises a vertically alternating sequence of the channel-level insulating layers 32A and inter-transistor-level insulating layers 32B; and a set of all electrically conductive layers {(44, 64), (46, 66)} within the alternating stack comprises a vertically alternating sequence of source layers 44 and drain layers 46.

In one embodiment, each of the metallic material layers (64, 66) contacts a sidewall of a respective one of the source layers 44 and the drain layers 46, and does not contact the ferroelectric gate dielectric layer 54. In one embodiment, each of the metallic material layers (64, 66) contacts a horizontal surface of a respective one of the source layers 44 and the drain layers 46, and contacts the ferroelectric gate dielectric layer 54.

In one embodiment, a plurality of memory openings 49 can vertically extend through the alternating stack of the insulating layers (32A, 32B) and the electrically conductive layers {(44, 64), (46, 66)}. The ferroelectric gate dielectric layer 54, the bipolar selector material layer 56, and the vertical word line 62 are located within a memory opening 49 of the plurality of memory openings 49.

In one embodiment, the ferroelectric gate dielectric layer 54 comprises a tubular gate dielectric portion extending through each of the electrically conductive layers {(44, 64), (46, 66)} and a bottom gate dielectric base portion adjoined to a bottom periphery of the tubular gate dielectric portion; the bipolar selector material layer 56 is laterally surrounded by the tubular gate dielectric portion and comprises a tubular selector material portion extending through each of the electrically conductive layers {(44, 64), (46, 66)} and a bottom selector material base portion adjoined to a bottom periphery of the tubular selector material portion; and the vertical word line 62 is laterally surrounded by the tubular selector material portion and extends through each of the electrically conductive layers {(44, 64), (46, 66)}.

In one embodiment, the bipolar selector material layer 54 comprises an ovonic threshold switch material.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of or the word" consists of replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A ferroelectric field effect transistor (FeFET) comprising:
   a semiconductor channel;
   a source region contacting one end of the semiconductor channel;
   a drain region contacting a second end of the semiconductor channel;
   a gate electrode;
   a ferroelectric gate dielectric layer located between the semiconductor channel and the gate electrode; and
   a bipolar selector material layer located between the gate electrode and the ferroelectric gate dielectric layer.

2. The FeFET of claim 1, further comprising a substrate having a horizontal surface, wherein:
   the semiconductor channel, the ferroelectric gate dielectric layer, the bipolar selector material layer, and the gate electrode extend along a vertical direction perpendicular to the horizontal surface; and
   the gate electrode comprises a portion of a vertical word line which extends perpendicular to the horizontal surface.

3. The FeFET of claim 2, wherein:
   the source region comprises a portion of a source layer;
   the drain region comprises portion of a drain layer;
   the source layer comprises at least a portion of a source line; and
   the drain layer comprises at least a portion of a bit line.

4. The FeFET of claim 3, further comprising a channel-level insulating layer located between the source region and the drain region.

5. A three dimensional FeFET array, comprising:
   the FeFET of claim 4;
   an additional FeFET located below the FeFET; and
   an inter-transistor-level insulating layer located between the source line of the FeFET and a bit line of the additional FeFET.

6. The three dimensional FeFET array of claim 5, wherein:
   the array comprises alternating stack of insulating layers and electrically conductive layers that alternate along the vertical direction;
   a set of all insulating layers within the alternating stack comprises a vertically alternating sequence of the channel-level insulating layers and inter-transistor-level insulating layers; and
   a set of all electrically conductive layers within the alternating stack comprises a vertically alternating sequence of the source layers and the drain layers.

7. The three dimensional FeFET array of claim 6, further comprising metallic material layers contacting a respective one of the source layers and the drain layers and located between vertically neighboring pairs of the insulating layers.

8. The three dimensional FeFET array of claim 7, wherein each of the metallic material layers contacts a sidewall of a respective one of the source layers and the drain layers, and does not contact the ferroelectric gate dielectric layer.

9. The three dimensional FeFET array of claim 7, wherein each of the metallic material layers contacts a horizontal surface of a respective one of the source layers and the drain layers, and contacts the ferroelectric gate dielectric layer.

10. The three dimensional FeFET array of claim 6, further comprising a plurality of memory openings vertically extending through the alternating stack of the insulating layers and the electrically conductive layers, wherein the ferroelectric gate dielectric layer, the bipolar selector material layer, and the vertical word line are located within a memory opening of the plurality of memory openings.

11. The three dimensional FeFET array of claim 10, wherein:
   the ferroelectric gate dielectric layer comprises a tubular gate dielectric portion extending through each of the electrically conductive layers and a bottom gate dielectric base portion adjoined to a bottom periphery of the tubular gate dielectric portion;
   the bipolar selector material layer is laterally surrounded by the tubular gate dielectric portion and comprises a tubular selector material portion extending through each of the electrically conductive layers and a bottom selector material base portion adjoined to a bottom periphery of the tubular selector material portion; and
   the vertical word line is laterally surrounded by the tubular selector material portion and extends through each of the electrically conductive layers.

12. The FeFET of claim 1, wherein the bipolar selector material layer comprises an ovonic threshold switch material.

13. A method of forming a semiconductor device, comprising:
   forming channel-level insulating layers over a substrate;
   forming a vertical stack of semiconductor channels at levels of the channel-level insulating layers;
   forming a stack including, from one side to another, a ferroelectric gate dielectric layer, a bipolar selector material layer, and a gate electrode directly on the vertical stack of semiconductor channels; and
   providing a source region on one end of each of the semiconductor channels and a drain region on another end of each of the semiconductor channels, wherein each of the semiconductor channels, the source regions, and the drain region contacts the ferroelectric gate dielectric layer, and each of the channel-level insulating layers contacts a respective one of the source regions and a respective one of the drain region.

14. The method of claim 13, wherein:
   each of the ferroelectric gate dielectric layer, the bipolar selector material layer, and the gate electrode is formed over the substrate, and extends along a vertical direction that is perpendicular to a top surface of the substrate;

each of the channel-level insulating layers is formed as a horizontally-extending layer having a top surface and a bottom surface; and each of the semiconductor channels is formed as a tubular structure on a sidewall of a respective one of the channel-level insulating layers.

15. The method of claim 14, further comprising forming inter-transistor-level insulating layers over the substrate such that the inter-transistor-level insulating layers are interfaced with the channel-level insulating layers, wherein:

each of the semiconductor contacts a sidewall of the ferroelectric gate dielectric layer; and vertically neighboring pairs of combinations of a respective semiconductor channel, a respective source region, and a respective drain region are vertically spaced apart by a respective one of the inter-transistor-level insulating layers.

16. The method of claim 15, further comprising:

forming an alternating stack of insulating layers and sacrificial material layers that alternate along the vertical direction over the top surface of the substrate, wherein a set of all insulating layers within the alternating stack comprises a vertically alternating sequence of the channel-level insulating layers and inter-transistor-level insulating layers; and replacing the sacrificial material layers with replacement material layers, each of the replacement material layers including a respective metallic material layer, wherein:

each sacrificial material layer other than a bottommost one of the sacrificial material layers and other than a topmost one of the sacrificial material layers contacts a respective overlying one of the insulating layers and a respective underlying one of the insulating layers;

each of the replacement material layers includes a respective source layer containing one of the source regions or a respective drain layer containing one of the drain regions.

17. The method of claim 16, wherein:

the source layers and the drain layers are formed on the ferroelectric gate dielectric layer; and the metallic material layers are formed on a sidewall of a respective one of the source layers and the drain layers, and are laterally spaced from the ferroelectric gate dielectric layer.

18. The method of claim 15, further comprising:

forming doped semiconductor layers over the substrate such that each doped semiconductor layer is formed between, and contacts, a vertically neighboring pair of one of the channel-level insulating layers and one of the sacrificial material layers, wherein each of the doped semiconductor layers comprises a respective source layer containing one of the source regions or a respective drain layer containing one of the drain regions; and replacing the sacrificial material layers with metallic material layers that contacts a horizontal surface of a respective one of doped semiconductor layers.

19. The method of claim 18, wherein the metallic material layers are formed on a sidewall of the ferroelectric gate dielectric layer.

20. The method of claim 15, further comprising forming a plurality of memory openings vertically extending through the alternating stack, wherein the ferroelectric gate dielectric layer, the bipolar selector material layer, and the gate electrode are located within a memory opening of the plurality of memory openings.

* * * * *